United States Patent
Iwaki et al.

(10) Patent No.: US 9,291,302 B2
(45) Date of Patent: Mar. 22, 2016

(54) DEVICE ATTACHMENT MEMBER

(75) Inventors: Noriaki Iwaki, Hekinan (JP); Hideyuki Tsutsumi, Kariya (JP); Masaki Kato, Toyota (JP); Toru Takahama, Toyohashi (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 341 days.

(21) Appl. No.: 13/980,093

(22) PCT Filed: Nov. 11, 2011

(86) PCT No.: PCT/JP2011/076030
§ 371 (c)(1),
(2), (4) Date: Jul. 17, 2013

(87) PCT Pub. No.: WO2012/105100
PCT Pub. Date: Aug. 9, 2012

(65) Prior Publication Data
US 2013/0306811 A1     Nov. 21, 2013

(30) Foreign Application Priority Data

Jan. 31, 2011   (JP) .................................. 2011-018873

(51) Int. Cl.
  *A47B 96/06*   (2006.01)
  *F16M 13/02*   (2006.01)
  *H05K 13/04*   (2006.01)
  *H05K 13/08*   (2006.01)

(52) U.S. Cl.
  CPC ........... *F16M 13/02* (2013.01); *H05K 13/0417* (2013.01); *H05K 13/08* (2013.01)

(58) Field of Classification Search
  CPC combination set(s) only.
  See application file for complete search history.

(56) References Cited

U.S. PATENT DOCUMENTS

| | | | |
|---|---|---|---|
| 6,901,311 B2 * | 5/2005 | Eschenweck | 700/220 |
| 6,968,610 B2 * | 11/2005 | Nagao et al. | 29/740 |
| 7,805,831 B2 * | 10/2010 | Saho et al. | 29/739 |
| 7,966,718 B2 * | 6/2011 | Kodama et al. | 29/739 |
| 9,040,195 B2 * | 5/2015 | Enari et al. | 429/179 |
| 2003/0135991 A1 | 7/2003 | Nagao et al. | |
| 2004/0148762 A1 | 8/2004 | Eschenweck | |

(Continued)

FOREIGN PATENT DOCUMENTS

| CN | 1518853 A | 8/2004 |
|---|---|---|
| CN | 100448341 C | 12/2008 |

(Continued)

OTHER PUBLICATIONS

Jun. 30, 2015 Office Action issued in Japanese Application No. 2011-018873.

(Continued)

*Primary Examiner* — Monica Millner
(74) *Attorney, Agent, or Firm* — Oliff PLC

(57) ABSTRACT

A device attachment member used for a manufacture work machine equipped with: a device necessary for performing a manufacture work; a main frame on which the device is to be installed; and a controller configured to control the device, the device attachment member including a main body to be attached to the device, wherein the device attachment member includes an identification-information recording medium in which is recorded identification information, the device being identified by the controller based on the identification information, the identification-information recording medium being incorporated in the main body.

8 Claims, 17 Drawing Sheets

(56) References Cited

U.S. PATENT DOCUMENTS

| | | |
|---|---|---|
| 2006/0085973 A1 | 4/2006 | Kodama et al. |
| 2008/0008511 A1 | 1/2008 | Chino |
| 2008/0147232 A1* | 6/2008 | Kuribayashi et al. ......... 700/160 |
| 2008/0241675 A1 | 10/2008 | Enari et al. |
| 2009/0229117 A1 | 9/2009 | Saho et al. |

FOREIGN PATENT DOCUMENTS

| | | |
|---|---|---|
| JP | 2002-271100 A | 9/2002 |
| JP | A-2003-218589 | 7/2003 |
| JP | A-2004-221518 | 8/2004 |
| JP | 2005-210078 A | 8/2005 |
| JP | A-2005-302919 | 10/2005 |
| JP | A-2006-327591 | 12/2006 |
| JP | A-2008-030436 | 2/2008 |
| JP | A-2008-257873 | 10/2008 |
| JP | A-2009-272651 | 11/2009 |

OTHER PUBLICATIONS

May 19, 2015 Office Action issued in Chinese Application No. 201180065795.9.

International Search Report issued in International Application No. PCT/JP2011/076030 dated Dec. 20, 2011.

English-language translation of International Preliminary Report on Patentability issued in International Application No. PCT/JP2011/076030 dated Aug. 6, 2013.

Nov. 18, 2014 Office Action issued in Japanese Application No. 2011-018873.

* cited by examiner

DEVICE ATTACHMENT MEMBER

TECHNICAL FIELD

The present invention relates to a device attachment member to be attached to a device configured to perform a manufacture work.

BACKGROUND ART

As a manufacture work machine, there is known, for instance, a manufacture work machine described in the following Patent Literature 1, namely, a manufacture work machine equipped with a device necessary for performing a manufacture work, a main frame on which the device is installed, and a controller for controlling the device. In such a manufacture work machine, it is possible to replace the device installed on the main frame with a different device, whereby a manufacture work machine with high versatility is realized.

CITATION LIST

Patent Literature

Patent Literature 1: JP-A-2004-221518

SUMMARY OF INVENTION

Technical Problem

In the manufacture work machine configured such that the device installed on the main frame can be replaced with a different device, it is possible to install, on the main frame, a selected one of various devices that are distributed in the market. As a result, various manufacture works can be performed, ensuring a higher degree of versatility of the manufacture work machine. On the other hand, if the devices are randomly distributed, there may be a risk that low-quality devices are distributed, for instance. In this instance, it is impossible to ensure the reliability of the devices, making it difficult to ensure the reliability of the manufacture work machine. The present invention has been developed in view of such situations. It is therefore an object of the invention to provide a device attachment member that enables distribution of devices to be managed.

Solution to Problem

To achieve the object indicated above, a device attachment member according to the present invention includes a main body to be attached to a device and an identification-information recording medium in which is stored identification information based on which the device is identified by a controller, and the identification-information recording medium is incorporated in the main body.

Advantageous Effects of Invention

The identification information indicated above is required by the controller to identify the device. If the controller cannot identify the device, the controller cannot control the device. That is, only the device to which is attached the device attachment member that is equipped with the identification-information recording medium is controlled by the controller. According to the device attachment member of the present invention, it is possible to manage distribution of the device by managing distribution of the device attachment member.

Forms of Invention

There will be explained various forms of an invention which is considered claimable (hereinafter referred to as "claimable invention" where appropriate). Each of the forms is numbered like the appended claims and depends from the other form or forms, where appropriate. This is for easier understanding of the claimable invention, and it is to be understood that combinations of constituent elements that constitute the invention are not limited to those described in the following forms. That is, it is to be understood that the claimable invention shall be construed in the light of the following description of various forms and embodiment. It is to be further understood that, as long as the claimable invention is construed in this way, any form in which one or more constituent elements is/are added to or deleted from any one of the following forms may be considered as one form of the claimable invention.

The following form (1) indicates a structure based on which the claimable invention is made. Forms in which the technical features of any of the following forms (2)-(18) are added to the form (1) may be forms of the claimable invention. In this respect, a form in which the technical features of the form (2) are added to the form (1) corresponds to claim 1. A form in which the technical features of the form (3) are added to claim 1 corresponds to claim 2. A form in which the technical features of the forms (4) and (5) are added to claim 2 corresponds to claim 3. A form in which the technical features of the form (9) are added to claim 2 or 3 corresponds to claim 4. A form in which the technical features of the form (10) are added to any one of claims 2-4 corresponds to claim 5. A form in which the technical features of the form (12) are added to any one of claims 1-5 corresponds to claim 6. A form in which the technical features of the form (13) are added to any one of claims 1-6 corresponds to claim 7. A form in which the technical features of the forms (14) and (15) are added to any one of claims 1-7 corresponds to claim 8.

(1) A device attachment member used for a manufacture work machine equipped with: a device necessary for performing a manufacture work; a main frame on which the device is to be installed; and a controller configured to control the device, the device attachment member comprising a main body to be attached to the device.

This form is a basis on which the claimable invention is made. There are listed, in this form, basic constituent elements of the device attachment member and basic constituent elements of the manufacture work machine in which the device attachment member is used. In the "manufacture work machine" described in this form, the device installed on the main frame can be replaced with a different device, making it possible to realize the manufacture work machine with high versatility.

The "manufacture work" described in this form, namely, a target work of the present manufacture work machine, is not particularly limited, but may include an assembling work of assembling a plurality of components (parts) into an assembled article and various works in which certain processing, treatment or the like is performed on a work object (which is a concept that includes "component (part)", "assembled article", "object to be processed or treated", etc.,). More specifically, as the work to perform certain processing, a work, such as a press work, in which the work object is deformed, a work, such as a cut-off work, in which a part of the work object is cut off, and a work, such as a cutting work, in which the work object is shaped, may be the target work, for instance. As the work to perform a certain treatment, a surface modification work in which a surface of the work object is modified by laser, plasma or the like, a coating work in which an adhesive, a coloring agent or the like is applied to the work object, a heat treatment work in which the work object is heated and cooled, and a surface finishing work such as grinding, may be the target work, for instance. Further, an inspection work of inspecting work results of the assembling work and the works in which certain processing, treatment or the like is performed may be the target work.

The "device" described in this form is a device necessary for performing the manufacture work. More specifically, where the target work is the assembling work, for instance, each of the following (a)-(d) may be installed on the main frame as the device described in this form: (a) a conveyor configured to perform conveyance for conveying one component from an outside of the manufacture work machine and for conveying the assembled article out of the manufacture work machine; (b) a component supplier configured to supply another component; (c) a work head device configured to hold another component supplied by the component supplier for mounting another component on a substrate or the like; and (d) a head moving device configured to move the work head device that holds the component for moving the component. In the assembling work or in the inspection work of inspecting the result of the assembling work, an image taking device, such as a camera, for taking an image of the component or the assembled article to recognize the position and the posture thereof, the assembling accuracy, etc., may be the above-indicated device configured to perform image taking processing as the work. In the assembling work, an adhesive applier for applying an adhesive to at least one of two components for bonding the two components to each other may be the above-indicated device configured to perform adhesive application as the work. Further, the device configured to perform laser processing or plasma processing may be the above-indicated device in the manufacture work in which the laser processing or the plasma processing is performed.

(2) The device attachment member according to the form (1), comprising an identification-information recording medium in which is recorded identification information, the device being identified by the controller based on the identification information, the identification-information recording medium being incorporated in the main body.

As described above, various kinds of devices are employable as the device that constitute the manufacture work machine. Such various kinds of devices are distributed in the market, resulting in enhanced versatility of the manufacture work machine. On the other hand, if the devices are randomly distributed, there may be a risk that low-quality devices are distributed. In this instance, it is impossible to ensure the reliability of the devices, and it becomes difficult to ensure the reliability of the manufacture work machine. In view of this, the device attachment member described in this form is equipped with the identification-information recording medium in which is recorded the identification information based on which the device is identified by the controller, and the identification-information recording medium is incorporated in the main body of the device attachment member. The identification information recorded in the identification-information recording medium is required by the controller to identify the device. If the controller cannot identify the device, the controller cannot control the device. That is, only the device to which the device attachment member equipped with the identification-information recording medium is attached is controlled by the controller. Accordingly, where a maker of the manufacture work machine manages distribution of the device attachment member, it is possible to prevent distribution of a device produced by a non-qualified third party and to ensure the reliability of the device and the reliability of the manufacture work machine.

The "identification-information recording medium" described in this form is a medium in which the identification information is recorded. For instance, the "identification-information recording medium" may be a medium in which the identification information is stored utilizing memory or the like, or may be a medium in which the identification information is recorded utilizing bar codes or the like. The identification information recorded in the identification-information recording medium needs to be inputted to the controller. For instance, identification information may be inputted to the controller by wireless communication, wired communication or the like, or may be inputted to the controller utilizing equipment, such as a bar code reader, capable of reading information. Moreover, where the identification-information recording medium that is visually recognizable by an operator is employed, the identification information may be inputted to the controller by the operator.

In the "identification-information recording medium", in addition to the identification information, there may be recorded various information such as performable-motion information and a distinction ID of the identification-information recording medium. The performable-motion information is information as to a motion that can be performed by the device recognized based on the identification information. The performable-motion information includes information of a motion itself that the device can perform when the device performs the manufacture work. For instance, where the device is the component supplier, the performable-motion information includes information that the component can be supplied. Where the device is the mounter, the performable-motion information includes information that the component can be held or released. Further, the performable-motion information includes capabilities, dimensions, etc., of the device.

(3) The device attachment member according to the form (2), comprising a transmitter which is capable of transmitting the identification information recorded in the identification-information recording medium and which incorporates the identification-information recording medium, the device attachment member functioning as a transmitter-equipped member.

According to this form, the identification information can be automatically inputted to the controller, thereby ensuring convenience.

(4) The device attachment member according to the form (3), wherein the main body has a hole that is open to a surface, and the transmitter is disposed in the hole.

The "hole" described in this form may be a closed-end hole or a through-hole as long as the hole has a shape that permits the transmitter to be disposed therein. The "transmitter" described in this form may be fitted in the hole with or without a clearance.

(5) The device attachment member according to the form (4), wherein the transmitter is disposed in the hole so as to be sealed by resin.

By managing distribution of the device attachment member equipped with the identification-information recording medium, it is possible to manage distribution of the device. However, where the device attachment member equipped with the identification-information recording medium can be easily duplicated, it becomes difficult to manage distribution of the device attachment member per se. In the device attachment member described in this form, the transmitter is disposed in the hole so as to be sealed by the resin, thereby making it difficult to take the transmitter out of the hole. If the transmitter should be forcibly taken out of the hole, the transmitter would be broken and the identification-information recording medium would be also broken. Accordingly, in the device attachment member described in this form, it is difficult for a third party to obtain the identification-information recording medium, rendering it difficult to duplicate the device attachment member equipped with the identification-information recording medium. Therefore, according to the device attachment member described in this form, it is possible to manage distribution of the device attachment member with high reliability, so that the reliability of the device and the manufacture work machine can be ensured.

(6) The device attachment member according to the form (5), wherein a surface of the resin in a state in which the transmitter is disposed in the hole is flush with the surface to which the hole of the main body is open.

According to this form, the surface to which the hole is open can be made flat, facilitating installation of the device attachment member to the main frame at the surface.

(7) The device attachment member according to the form (5) or (6), wherein the resin is thermoplastic resin.

According to this form, the thermoplastic resin softened by being heated is poured into the hole, whereby the transmitter can be disposed in the hole so as to be sealed by the thermoplastic resin without any clearance. According to this form, it becomes difficult to take the transmitter out of the hole.

(8) The device attachment member according to any one of the forms (4)-(7), wherein the hole is formed such that an opening thereof is located at a position at which the opening is opposed to an antenna that is provided on the main frame and that can receive the identification information, in a state in which the device to which the main body of the device attachment member is attached is installed on the main frame.

This form can reduce a communication distance of the transmitter, enabling downsizing of the transmitter.

(9) The device attachment member according to any one of the forms (3)-(8), wherein the transmitter is an RF tag.

The "RF tag" described in this form is used in a system in which information is exchanged by wireless communication, namely, the so-called RFID (Radio Frequency Identification), and is called a wireless tag or an IC tag. In some RF tags, it is very difficult to read the identification information recorded therein unless formal procedures are executed when reading the identification information. That is, some RF tags are very difficult to be duplicated. According to this form, therefore, even if the transmitter is taken out of the hole without being broken, the transmitter per se is configured to be difficult to be duplicated and accordingly distribution of the device attachment member can be managed with higher reliability.

(10) The device attachment member according to any one of the forms (3)-(9), wherein the transmitter is configured such that the identification information recorded in the identification-information recording medium is transmitted according to a protocol different from a protocol according to which the controller transmits a command for controlling the device.

(11) The device attachment member according to any one of the forms (1)-(10), comprising a communication cable which is provided on the main body and through which the controller transmits a command for controlling the device.

In an instance where a maker of the manufacture work machine in which the device attachment member equipped with the identification-information recording medium is used gives another maker (hereinafter referred to as a "third vendor" where appropriate to be distinguished from the maker indicated above) permission to produce the device, it is required to provide the third vendor with the device attachment member equipped with the identification-information recording medium. It is further required to disclose control logic in accordance with commands from the controller for assuring operations of the device according to the commands from the controller. It is noted however that, where a communication path of the commands from the controller is identical with a communication path of the identification information, logic for reading the identification information is also disclosed by the disclosure of the control logic. Accordingly, even if there is employed, as the transmitter, the RF tag in which the identification information recorded therein is difficult to be read, the identification information can be easily read from the RF tag. That is, even if the RF tag is originally constructed to be difficult to be duplicated, the disclosure of the logic for reading the identification information may cause the RF tag to be easily duplicated. In the above two forms, the transmission path of the commands of the controller for controlling the device differs from the transmission path of the identification information. Therefore, even if the control logic is disclosed, the logic for reading the identification information is not disclosed. Accordingly, the above two forms sufficiently enjoys the advantage of employing, as the transmitter, the RF tag configured such that the identification information recorded therein is difficult to be read.

The "protocol" described in the former one of the above two forms defines an agreement, a procedure, a rule or the like as to communication between the controller and the device attachment member. The "protocol" described in the former one of the above two forms includes not only an agreement of communication data itself, but also an agreement of a transmission path of data or the like between the controller and the device attachment member, more specifically, an agreement of the kind of cables and connectors in wired communication, an agreement of frequency bands in wireless communication, and so on.

(12) The device attachment member according to any one of the forms (1)-(11), comprising a device-side terminal fixed to the main body and configured to be connected to a frame-side terminal provided in the main frame, for electrically connecting the device and the controller to each other via the main body when the device is controlled by the controller, the controller being configured to transmit a command for controlling the device via the device-side terminal.

According to this form, an electric connection portion of the device with respect to the main frame is provided in the device attachment member. Therefore, it is not necessary to provide, in the device itself, the electric connection portion with respect to the main frame, simplifying production, design, and so on of the device.

(13) The device attachment member according to any one of the forms (1)-(12), comprising a device-side engagement portion provided in the main body for positioning the device at a prescribed position and configured to engage a frame-side engagement portion provided in the main frame.

In this form, the device is installed at the prescribed position, thereby ensuring a reference point upon operating of the device. In this respect, the reference point upon operating is a reference point when the device operates, and the motion of the device is controlled using the reference point as an origin.

(14) The device attachment member according to any one of the forms (1)-(13), wherein the main body is configured such that the device is installed on the main frame via the main body.

(15) The device attachment member according to the form (14), wherein the main body includes a device attachment surface to be attached to the device and a frame contact surface to be held in close contact with a part of the main frame when the device to which the main body is attached is installed on the mainframe.

(16) The device attachment member according to the form (15), wherein the main body comprises a plate-like member, one of opposite surfaces of the plate member functioning as the device attachment surface while the other of the opposite surfaces functions as the frame contact surface, the plate member being sandwiched between the device and the main frame in a state in which the device is installed on the main frame.

According to the above three forms, the device is installed on the main frame via the device attachment member. It is accordingly not necessary to provide, in the device, any mechanism for installation on the main frame, simplifying production, design, and so on, of the device.

(17) The device attachment member according to the form (15) or (16), wherein the main body has a hole that is open to a surface, wherein the device attachment member comprises a transmitter which is disposed in the hole and which is capable of transmitting identification information, the device being identified by the controller based on the identification information, and wherein the surface to which the hole is open is the frame contact surface.

This form makes it easy to obtain transmitted identification information on the main frame side.

(18) The device attachment member according to any one of the forms (1)-(17), wherein, in a state in which the device attachment member is mounted on a device holder for holding the device and is axed to a device-holder moving device that constitutes the main frame, the device attachment member is moved by the device-holder moving device, together with the device.

Where there is employed, as the above-indicated device, a device capable of performing a work in which a certain component or the like is mounted on the work object, a work in which certain processing, treatment or the like is performed on the work object, and so on, a moving device for moving the device to the vicinity of the work object is required. According to this form, such a moving device is provided as a constituent element of the main frame.

DESCRIPTION OF EMBODIMENT

There will be hereinafter explained in detail one embodiment of the claimable invention with reference to drawings. It is to be understood that the claimable invention may be embodied with various changes and modifications based on the knowledge of those skilled in the art, in addition to the following embodiment and various forms described in the FORMS OF INVENTION.

Embodiment

<Structure of Manufacture Work Machine>

Figure 1:
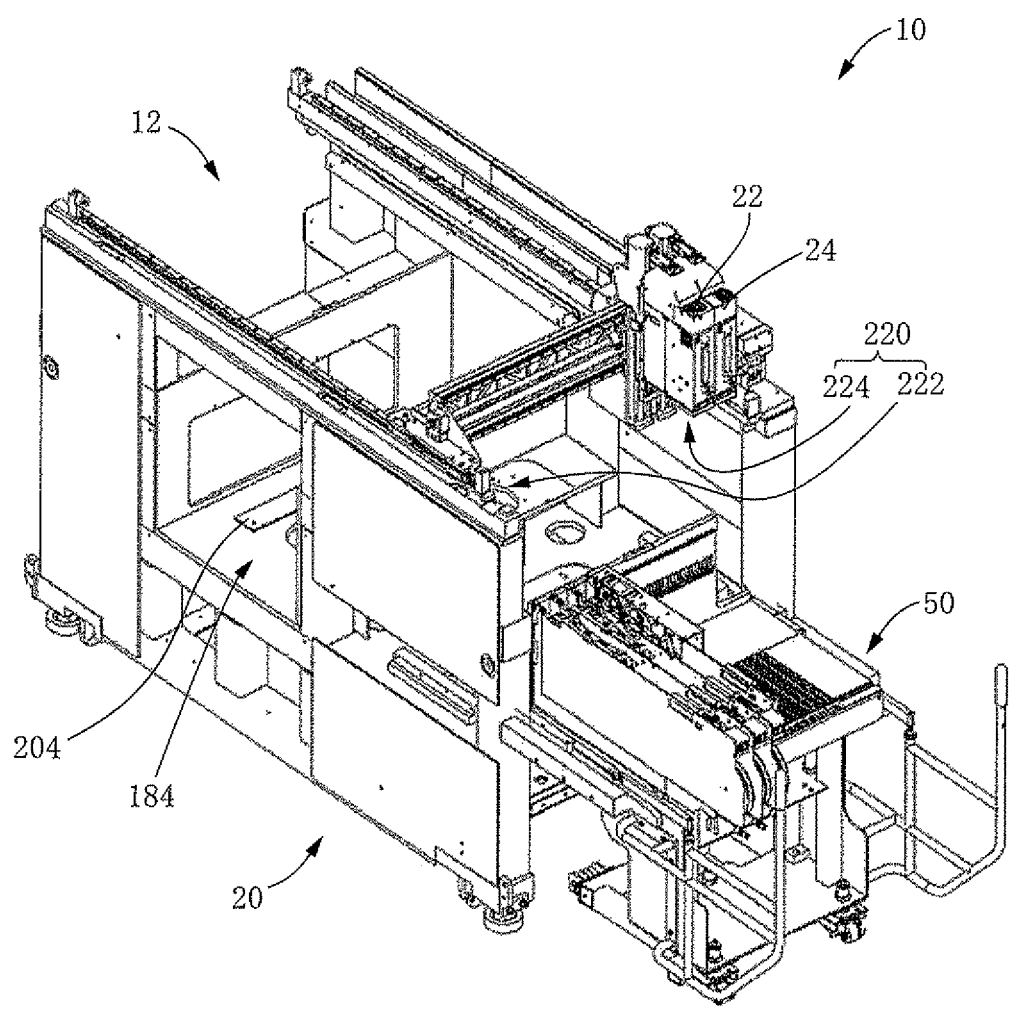
FIG. 1 is a perspective view showing a manufacture work machine in a state in which devices are installed on a main frame via respective device attachment members according to one embodiment of the claimable invention.

In FIG. 1, there is shown a manufacture work machine 10 equipped with device attachment members according to one embodiment. The manufacture work machine 10 is an assembling work machine configured to perform an assembling work as a manufacture work. More specifically, the manufacture work machine 10 is a work machine configured to perform a work of mounting, onto a substrate as a first component, a mount component as a second component. The manufacture work machine 10 includes a plurality of devices configured to perform respective work elements that constitute the assembling work to be performed by the manufacture work machine 10. The plurality of devices are configured to be installed on a main frame 12 shown in FIG. 2 via corresponding device attachment members. In the following explanation, a longitudinal direction of the main frame 12 is referred to as a front-rear direction, a horizontal direction perpendicular to the longitudinal direction is referred to as a left-right direction, and a vertical direction perpendicular to the longitudinal direction is referred to as an up-down direction.

The main frame 12 includes a base 20 and a head moving device 26 configured to move two work head devices 22, 24 that will be explained in detail. The head moving device 26 as a device-holder moving device is an XYZ-robot-type moving device and is disposed at an upper end of the base 20. The head moving device 26 includes a planar-type moving device 32 configured to move two sliders 28, 30 together along the horizontal plane. The two work head devices 22, 24 are installed on the respective sliders 28, 30. The planar-type moving device 32 is constituted by: a left-right direction moving device (X-direction moving device) 34 configured to linearly move the two sliders 28, 30 in the left-right direction; and a front-rear direction moving device (Y-direction moving device) 36 configured to linearly move the two sliders 28, 30 in the front-rear direction. In other words, the planar-type moving device 32 is configured to move the two sliders 28, 30 to respective arbitrary positions on the horizontal plane. The head moving device 26 further includes two up-down direction moving devices (Z-direction moving devices) 38, 40 configured to move the corresponding sliders 28, 30 in the up-down direction independently of each other. The up-down direction moving devices 38, 40 are configured to be moved by the planar-type moving device 32 on the horizontal plane, together with the slider 28, 30, and to move the sliders 28, 30 to respective arbitrary positions in the up-down direction at the respective arbitrary positions on the horizontal plane. That is, the head moving device 26 is configured to move the work head devices 22, 24 to respective arbitrary positions and to permit the work head devices 22, 24 to perform respective works at the respective arbitrary positions.

As shown in FIG. 1, the plurality of devices installed on the main frame 12 include a component supplier 50 configured to supply mount components, a first work head device 22 configured to perform a main work in a work of mounting the mount component on the substrate, and a second work head device 24 configured to perform an auxiliary work for the main work. The component supplier 50 is disposed at one end, in the front-rear direction, of the base 20 that partially constitutes the main frame 12. The two work head devices 22, 24 are disposed on the respective sliders 28, 30 of the head moving device 26 that partially constitutes the main frame 12.

Figure 3:
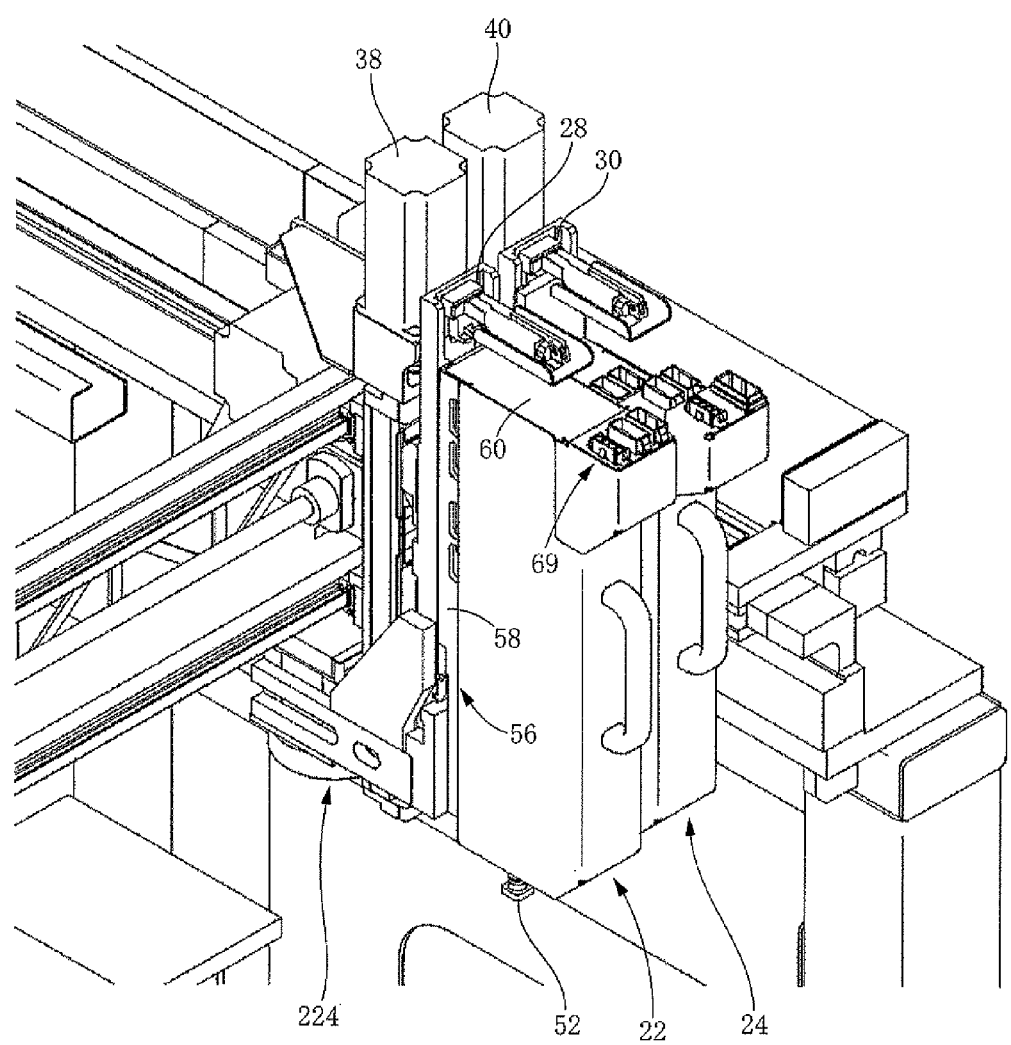
FIG. 3 is an enlarged view showing work head devices shown in FIG. 1.
Figure 4:
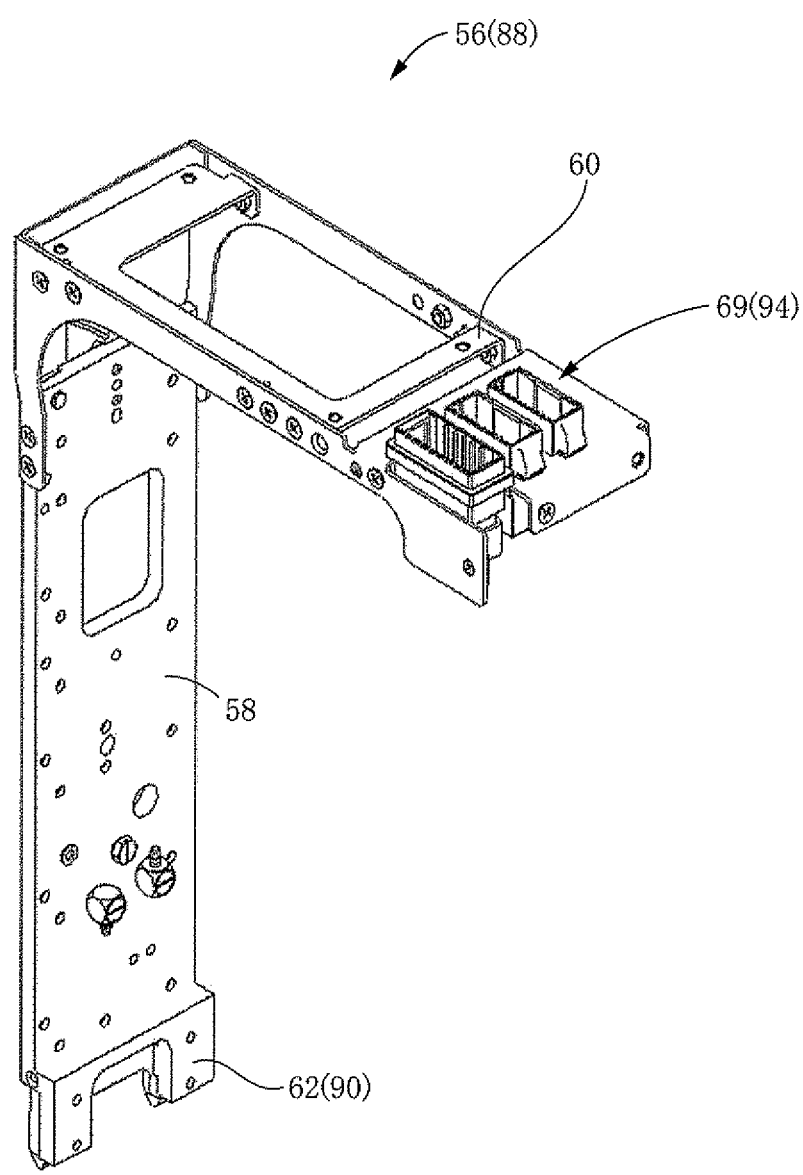
FIG. 4 is a perspective view showing the device attachment member attached to each work head device shown in FIG. 3.
Figure 5:
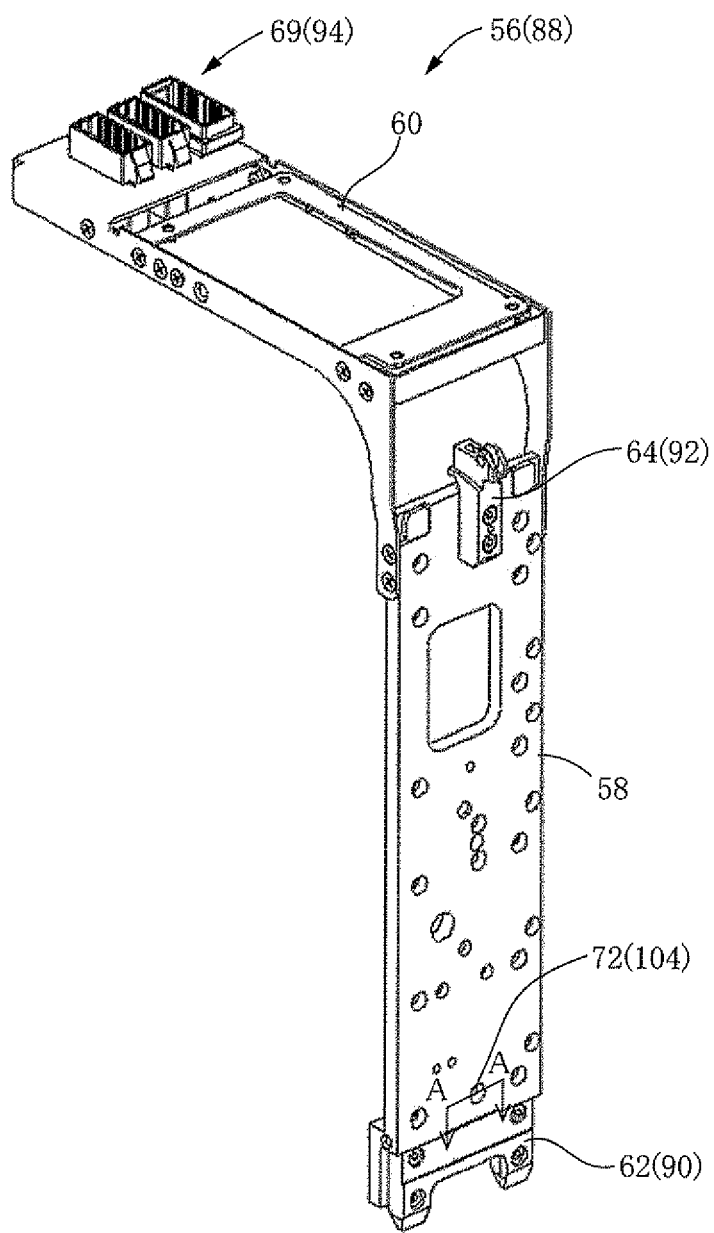
FIG. 5 is a perspective view showing the device attachment member of FIG. 4 as viewed from one side thereof opposite to FIG. 4.

The first work head device 22 is capable of holding the mount component supplied from the component supplier 50 so as to convey the mount component. As shown in FIG. 3, the first work head device 22 has, at its lower end, a component suction nozzle 52. The first work head device 22 is a component holding head 22 capable of suction-holding and releasing the component by means of the component suction nozzle 52. More specifically, the component suction nozzle 52 communicates with a negative-pressure air passage and a positive-pressure air passage via a positive/negative pressure supplier 54 (FIG. 15) and is configured to suction-hold the component by a negative pressure and to release the suction-held component by a slight positive pressure supplied thereto. The component holding head 22 is installed on the slider 28, as a device holder, of the head moving device 26 via an interface 56 for the component holding head 22 (hereinafter abbreviated as "holding head IF 56" where appropriate) shown in FIGS. 4 and 5. The holding head IF 56 is one example of the device attachment member. FIG. 5 is a perspective view showing the holding head IF 56 as viewed from one side thereof opposite to FIG. 4.

Figure 2:
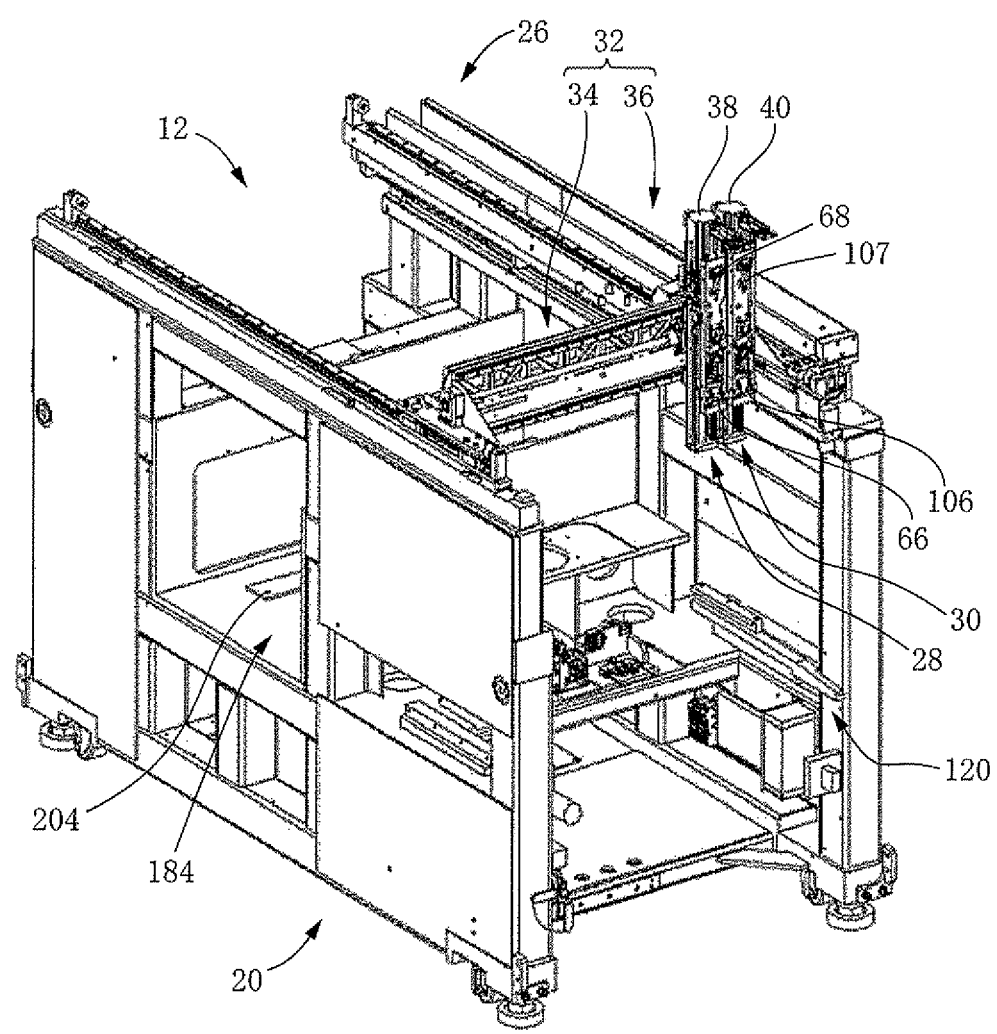
FIG. 2 is a perspective view showing the manufacture work machine of FIG. 1 in a state in which the devices and the device attachment members are removed.

The holding-head IF 56 includes a rear plate portion 58, as a main body, having a generally rectangular shape, and an upper plate portion 60 extending from an upper end of the rear plate portion 58 in a direction perpendicular to the rear plate portion 58. The holding-head IF 56 is attached to a rear surface of the component holding head 22 on one surface thereof (shown in FIG. 4) functioning as a device attachment surface, the one surface being on one side of the rear plate portion 58 on which the upper plate portion 60 extends. Further, the holding-head IF 56 is attached to an upper end surface of the component holding head 22 on a lower surface of the upper plate portion 60. A leg portion 62 is provided at a lower end of the rear plate portion 58 of the holding-head IF 56, and an engagement block 64 is provided at an upper end portion of another surface of the rear plate portion 58 (shown in FIG. 5), functioning as a frame contact surface, that is not attached to the component holding head 22. On the other hand, as shown in FIG. 2, a support portion 66 is provided at a lower end portion of the slider 28 of the head moving device 26 for supporting the leg portion 62 of the holding-head IF 56, and a block fitting portion 68 is provided at a front-side upper portion of the slider 28. The block fitting portion 68 is configured to engage the engagement block 64 of the holding-head IF 56 for fixation.

A distal end of the leg portion 62 of the holding-head IF 56 is formed so as to have a wedge shape and is configured to be fitted into the V-shaped support portion 66 of the slider 28, thereby defining a position of the component holding head 22 in the up-down direction. Further, the engagement block 64 of the holding-head IF 56 is configured to be fitted in the block fitting portion 68 of the slider 28, such that side surfaces of the engagement block 64 come into close contact with the block fitting portion 68, thereby defining a position of the component holding head 22 in the left-right direction. In other words, the support portion 66 and the block fitting portion 68 each as a frame-side engagement portion engage the leg portion 62 and the engagement block 64 each as a device-side engagement portion, thereby making it possible to install the component holding head 22 at a prescribed position of the slider 28 via the holding-head IF 56. It is noted here that the fixation of the engagement block 64 with respect to the block fitting portion 68 can be released with one-touch action. Accordingly, the holding-head IF 56, namely, the component holding head 22, is installable on and removable from the slider 28.

A holding-head connector 69 is provided at a distal end of the upper plate portion 60 of the holding-head IF 56. The holding-head connector 69 is electrically connected to the component holding head 22 via communication lines (not shown). The holding-head connector 69 as a device-side terminal is connected to a frame-side terminal (not shown) provided in the main frame 12, whereby the component holding head 22 is electrically connected to a main central control device 70 (FIG. 15), as a controller, that will be explained in detail. Thus, the holding-head IF 56 and the component holding head 22 are integral to each other, and the holding-head IF 56 functions as an electric and physical interface for the component holding head 22.

Figure 6:
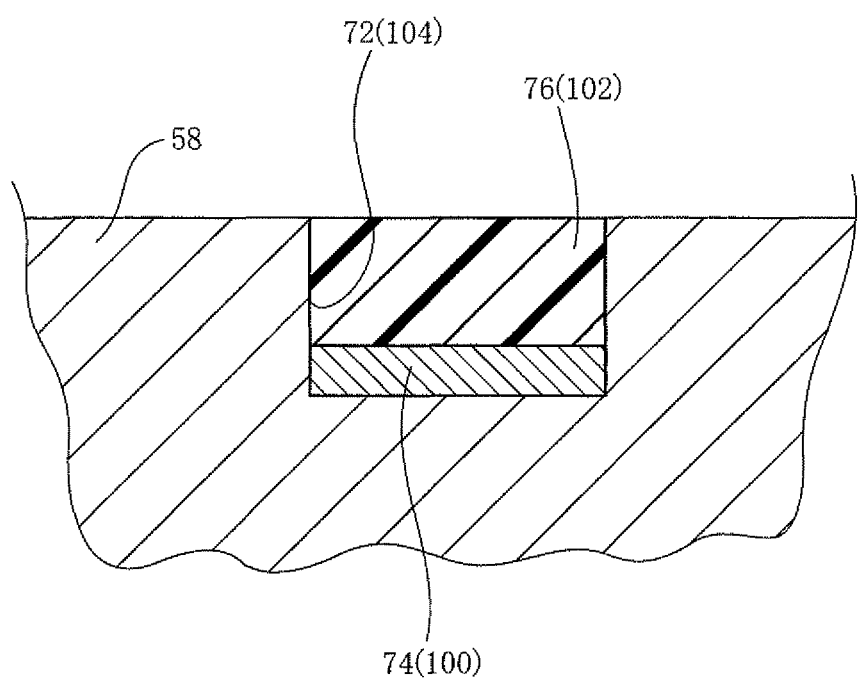
FIG. 6 is a cross-sectional view taken along line A-A in FIG. 5.

As shown in FIG. 5, a closed-end hole 72 is formed at a lower end portion of the above-indicated frame contact surface of the rear plate portion 58 of the holding-head IF 56 to which the slider 28 is to be attached. In the closed-end hole 72, an RF tag 74 is disposed so as to be sealed by resin 76, as shown in the cross-sectional view of FIG. 6 taken along line A-A in FIG. 5. The RF tag 74 is constituted by: an IC chip 78 (FIG. 15), as an identification-information recording medium, in which is recorded identification information based on which the component holding head 22 is identified by the main central control device 70 (FIG. 15) that will be explained; and an antenna 80 (FIG. 15) for transmitting the identification information recorded in the IC chip 78. The RF tag 74 functions as a transmitter configured to transmit the identification information. The RF tag 74 has a cylindrical shape with a small height and has an outside diameter that is substantially the same as an inside diameter of the closed-end hole 72, whereby the RF tag 74 is fitted in the closed-end hole 72 without clearance. The resin 76 by which the RF tag 74 is sealed in the closed-end hole 72 is thermoplastic resin. The resin 76 softened by being heated is poured into the closed-end hole 72 in which the RF tag 74 is fitted, and the resin 76 is cured, so that the RF tag 74 is sealed in the closed-end hole 72 by the resin 76. The resin 76 softened by being heated is poured into the closed-end hole 72 so as to reach the edge of the closed-end hole 72, so that the surface of the resin 76 is flush with the surface of the rear plate portion 58 to which the closed-end hole 72 is open.

The holding-head IF 56 equipped with the RF tag 74 as the transmitter functions as a transmitter-equipped member. The slider 28 to which the holding-head IF 56 is attached is provided with an antenna 82 (FIG. 15) capable of receiving the identification information transmitted from the RF tag 74. The antenna 82 is disposed at a position at which the antenna 82 is opposed to the opening of the closed-end hole 72 formed in the rear plate portion 58 in a state in which the holding-head IF 56 is attached to the slider 28, so that the antenna 82 can receive the identification information transmitted from the RF tag 74. The antenna 82 is connected to the main central control device 70 (FIG. 15) and transmits the received identification information to the control device, thereby permitting the component holding head 22 to be identified by the control device.

Figure 7:
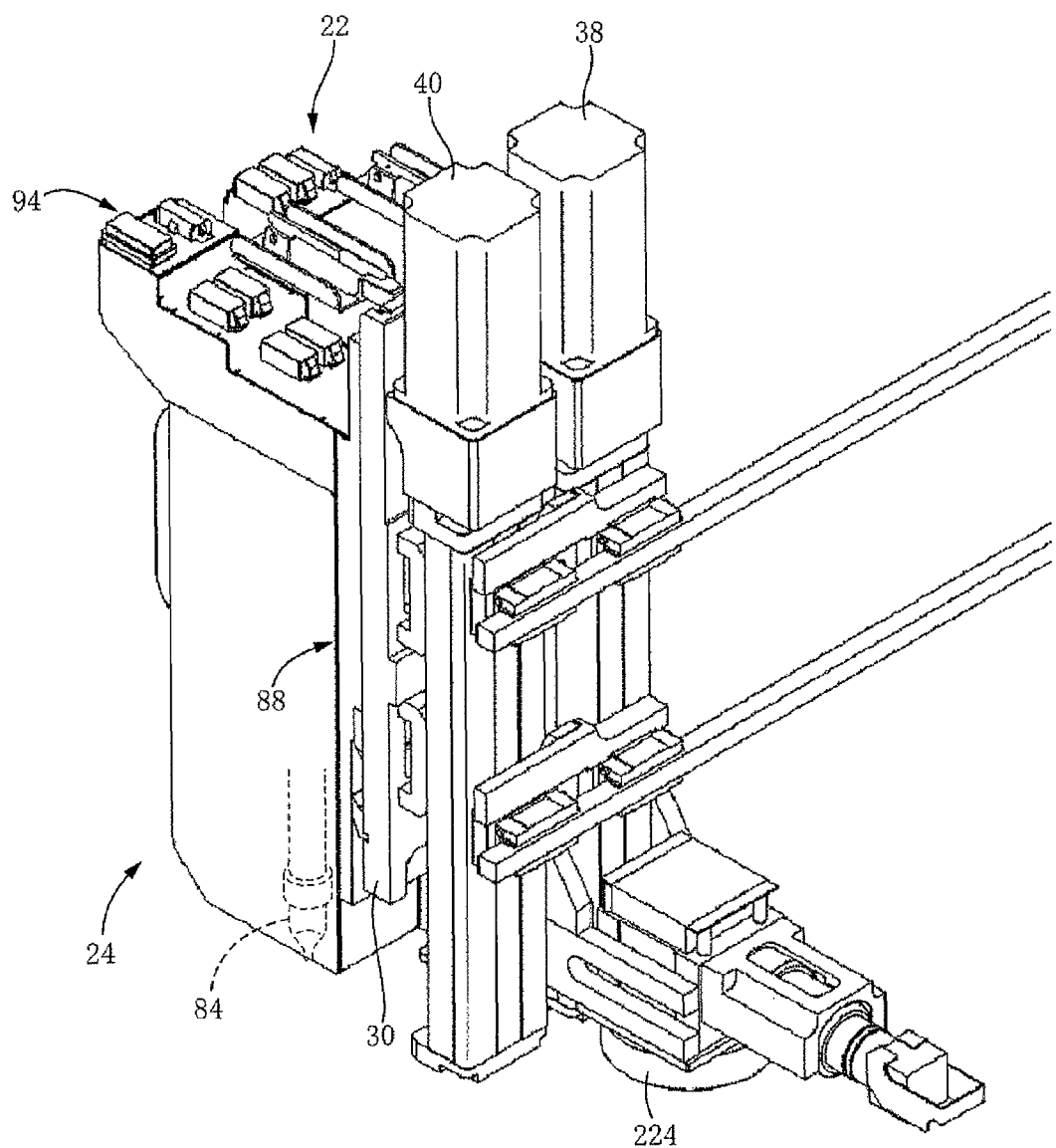
FIG. 7 is a perspective view showing the work head devices shown in FIG. 3 as viewed from one side thereof opposite to FIG. 3.

The second work head device 24 is capable of performing an auxiliary work element necessary for mounting, on the substrate, the mount component held by the component holding head 22. More specifically, as shown in FIG. 7, the second work head device 24 is a dispenser head 24 having, at its lower end, a dispenser nozzle 84 and an ejection device 86 (FIG. 15) for ejecting an arbitrary amount of adhesive from the dispenser nozzle 84. Like the component holding head 22, the dispenser head 24 is installed on the slider 30 of the head moving device 26 via an interface 88 for the dispenser head 24 (hereinafter abbreviated as "dispenser-head IF 88" where appropriate) having substantially the same structure as the holding-head IF 56. The dispenser-head IF 88 is also provided with a leg portion 90, an engagement block 92, a dispenser-head connector 94, an RF tag 100 including an IC chip 96 (FIG. 15) and an antenna 98 (FIG. 15), and a closed-end hole 104 in which the RF tag 100 is disposed so as to be sealed by resin 102. The slider 30 is also provided with a support portion 106 for supporting the leg portion 90 of the dispenser-head IF 88, a block fitting portion 107 into which the engagement block 92 is fitted, and an antenna 108 (FIG. 15) capable of receiving the identification information transmitted from the RF tag 100. Accordingly, the dispenser-head IF 88 functions as an electric and physical interface for the dispenser head 24 and also functions as a transmitter-equipped member equipped with the transmitter capable of transmitting the identification information of the dispenser head 24.

Figure 8:
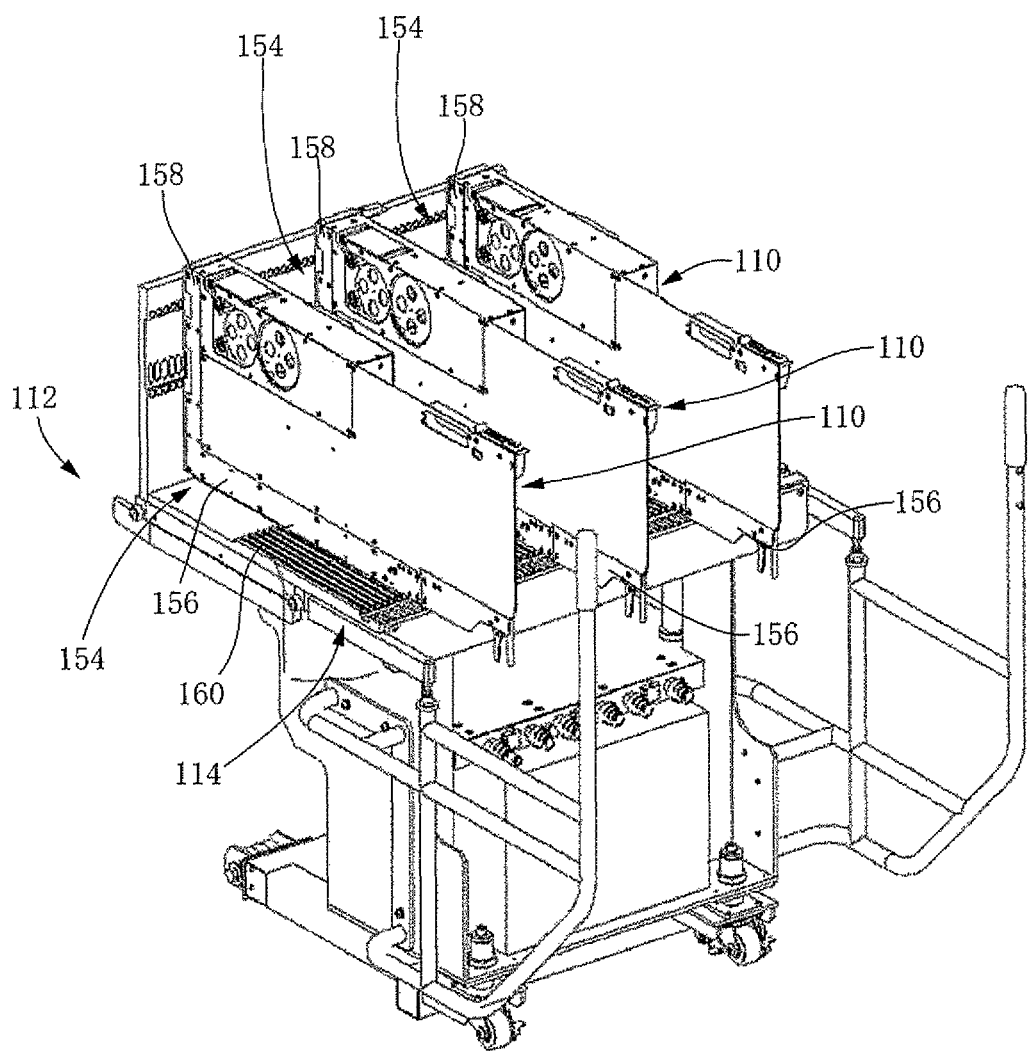
FIG. 8 is a perspective view showing a component supplier shown in FIG. 1.
Figure 9:
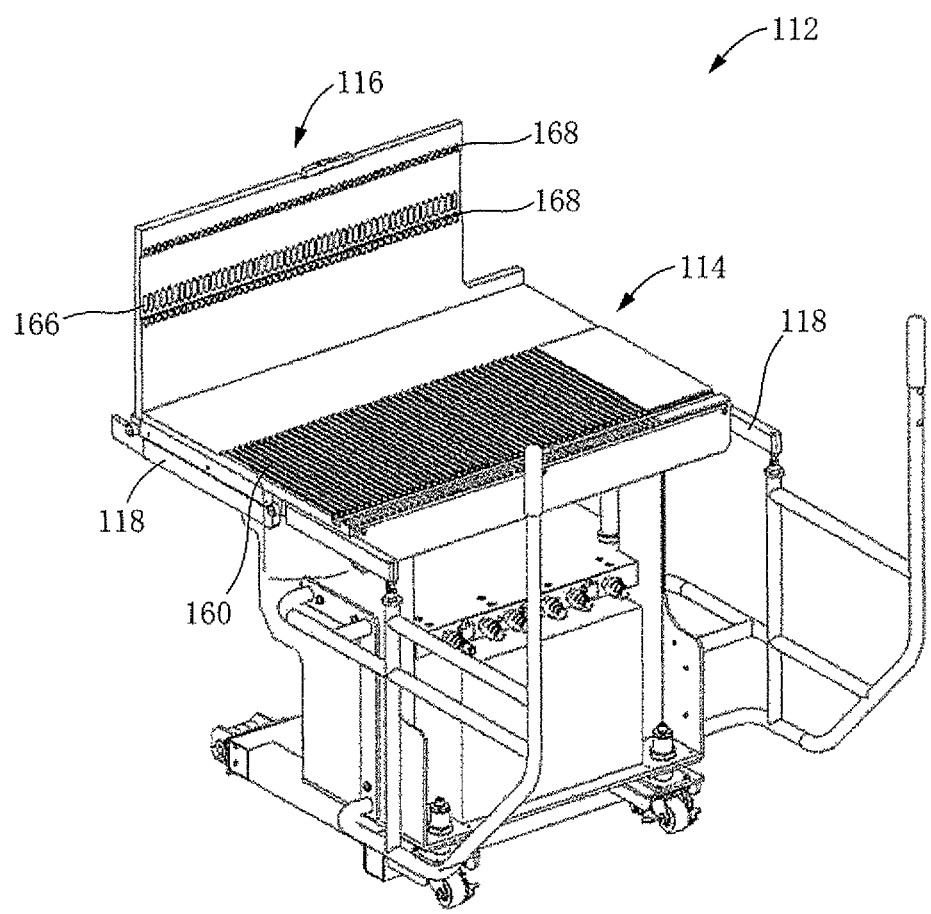
FIG. 9 is a perspective view showing a feeder holding table of the component supplier shown in FIG. 8.
Figure 10:
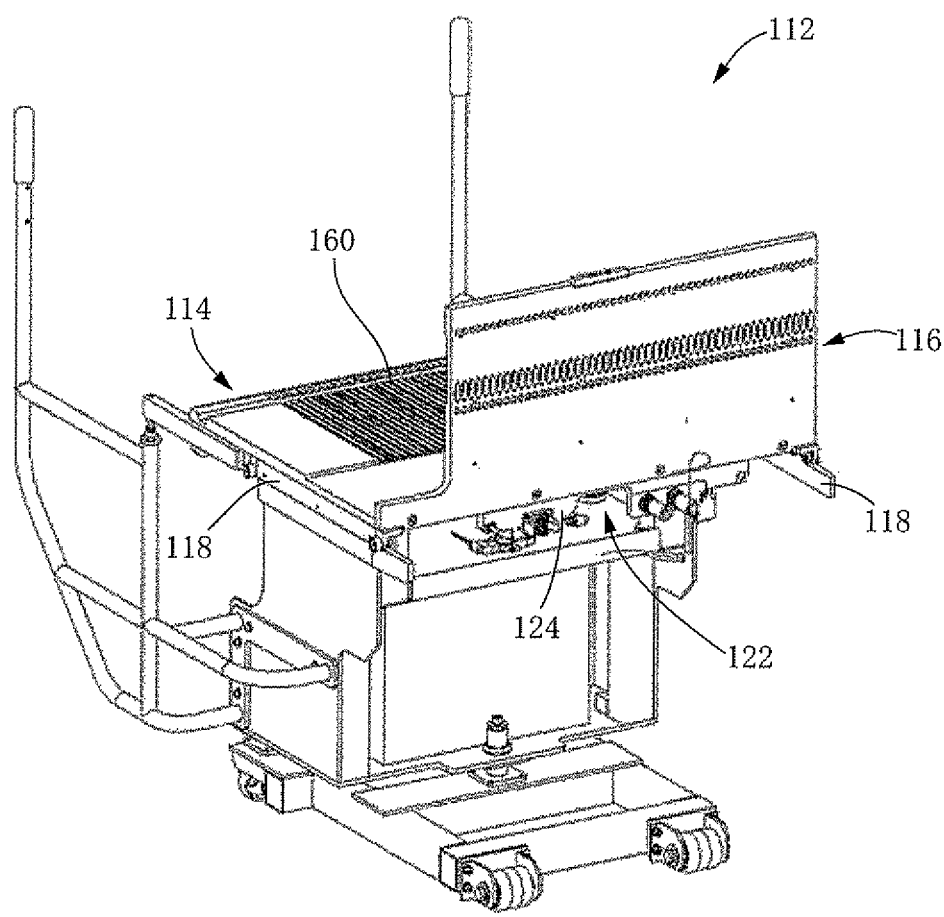
FIG. 10 is a perspective view showing the feeder holding table of FIG. 9 as viewed from one side thereof opposite to FIG. 9.

As shown in FIG. 8, the component supplier 50 is a feeder-type supplier. The component supplier 50 includes: a plurality of tape feeders 110 each configured to supply the mount components one by one at a prescribed component-supply position; and a feeder holding table 112 that holds the plurality of tape feeders 110. As shown in FIGS. 9 and 10, the feeder holding table 112 is constituted by a horizontal support plate 114 and an upright wall 116 that extends in the vertical direction from one end of the support plate 114 in the front-rear direction thereof. A pair of guide rails 118 are provided at end portions of the support plate 114 in the left-right direction. On the other hand, as shown in FIG. 2, a slide mechanism 120 is disposed at one end of the base 20 of the main frame 12 in the front-rear direction. The slide mechanism 120 is configured to slidingly move the guide rails 118 in the horizontal direction, and the feeder holding table 112 is arranged to be inserted into the base 20 along the slide mechanism 120 from the front side of the base 20.

When the feeder holding table 112 is inserted into the base 20, the feeder holding table 112 is installed on the base 20 via an interface 122 for the feeder holding table 112 (hereinafter abbreviated as "holding-table IF 122" where appropriate) as a device attachment member for the feeder holding table 112. As shown in FIG. 10, the holding-table IF 122 is fixedly provided at the one end of the support plate 114 of the feeder holding table 112 from which the upright wall 116 extends. The holding-table IF 122 includes a connection surface 124 that extends downward from the one end of the support plate 114.

Figure 11:
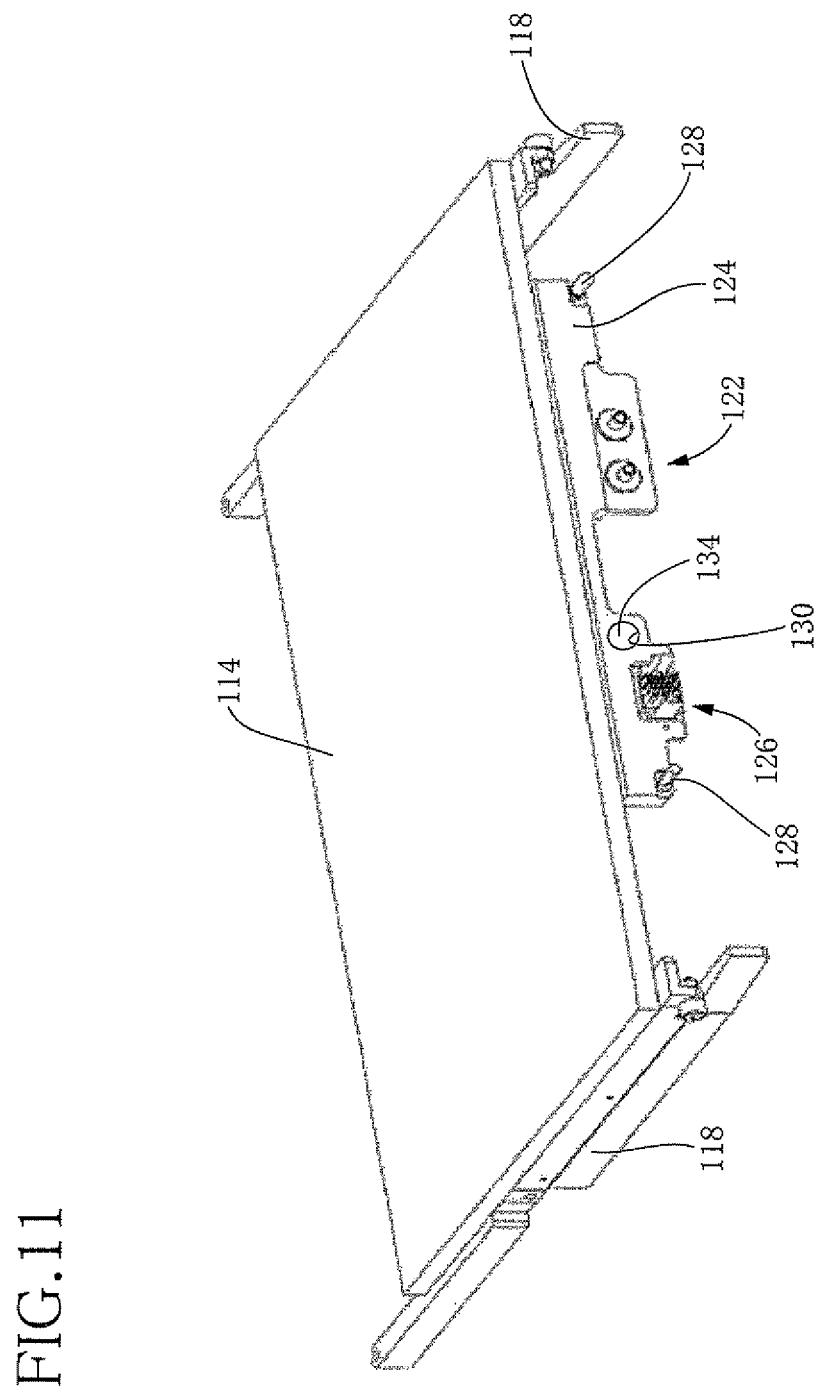
FIG. 11 is an enlarged view of a part of the feeder holding table shown in FIG. 10.
Figure 15:
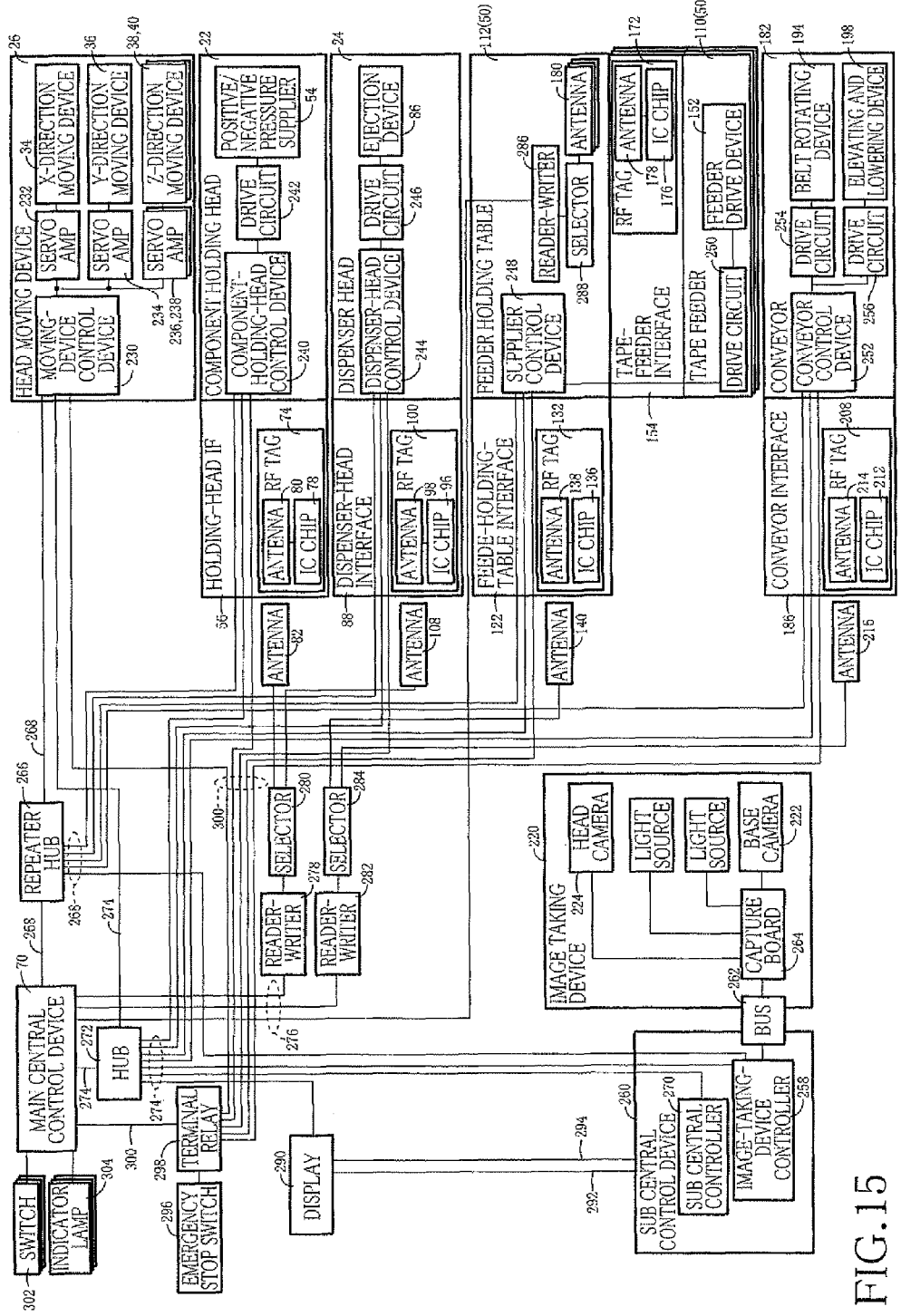
FIG. 15 is a block diagram schematically showing the manufacture work machine of FIG. 1.

As shown in FIG. 11, a holding-table connector 126 is provided on the connection surface 124. The holding-table connector 126 is electrically connected to the feeder holding table 112. The holding-table connector 126 as a device-side terminal is connected to a frame-side terminal (not shown) provided in the base 20, whereby the feeder holding table 112 is electrically connected to the main central control device 70 (FIG. 15). In FIG. 11, there are only shown the support plate 114 of the feeder holding table 112, the holding-table IF 122 provided on the support plate 114, and the pair of guide rails 118. On the connection surface 124 of the holding-table IF 122, there are provided a pair of engagement pins 128 that extend in the horizontal direction. When the feeder holding table 112 is inserted into the base 20, the pair of engagement pins 128 come into engagement with a pair of engagement holes (not shown) formed in the base 20. According to the arrangement, the feeder holding table 112 is installed on the base 20 at a prescribed position of the base 20. Thus, the holding-table IF 122 functions as an electric and physical interface for the feeder holding table 112.

A closed-end hole 130 is formed in the connection surface 124 of the holding-table IF 122, as in the holding-head IF 56. In the closed-end hole 130, an RF tag 132 (FIG. 15) having the same structure as the RF tags 74, 100 is disposed so as to be sealed by resin 134. Like the RF tags 74, 100, the RF tag 132 is constituted by an IC chip 136 and an antenna 138 (FIG. 15). An antenna 140 (FIG. 15) capable of receiving the identification information transmitted from the RF tag 132 is provided in the base 20 such that the antenna 140 is opposed to the opening of the closed-end hole 130 in a state in which the feeder holding table 112 is installed on the base 20. The antenna 140 is connected to the main central control device 70 (FIG. 15) and is configured to transmit the received identification information to the control device, thereby permitting the feeder holding table 112 to be identified by the control device. That is, the holding-table IF 122 functions as a transmitter-equipped member equipped with the transmitter capable of transmitting the identification information of the feeder holding table 112.

Each of the plurality of tape feeders 110 held on the feeder holding table 112 includes: a reel (not shown) around which is wound a taping as the mount component in the form of a tape; and a feeder drive device 152 (FIG. 15) configured to feed the taping from the reel by a prescribed pitch. Each tape feeder 110 is capable of feeding the mount component at a prescribed component-supply position. Each tape feeder 110 is configured to be installed on the feeder holding table 112 via an interface 154 for each tape feeder 110 (hereinafter abbreviated as "feeder IF 154" where appropriate) as a device attachment member for each tape feeder 110. The feeder IF 154 functions as an electric and physical interface for the tape feeder 110.

Figure 12:
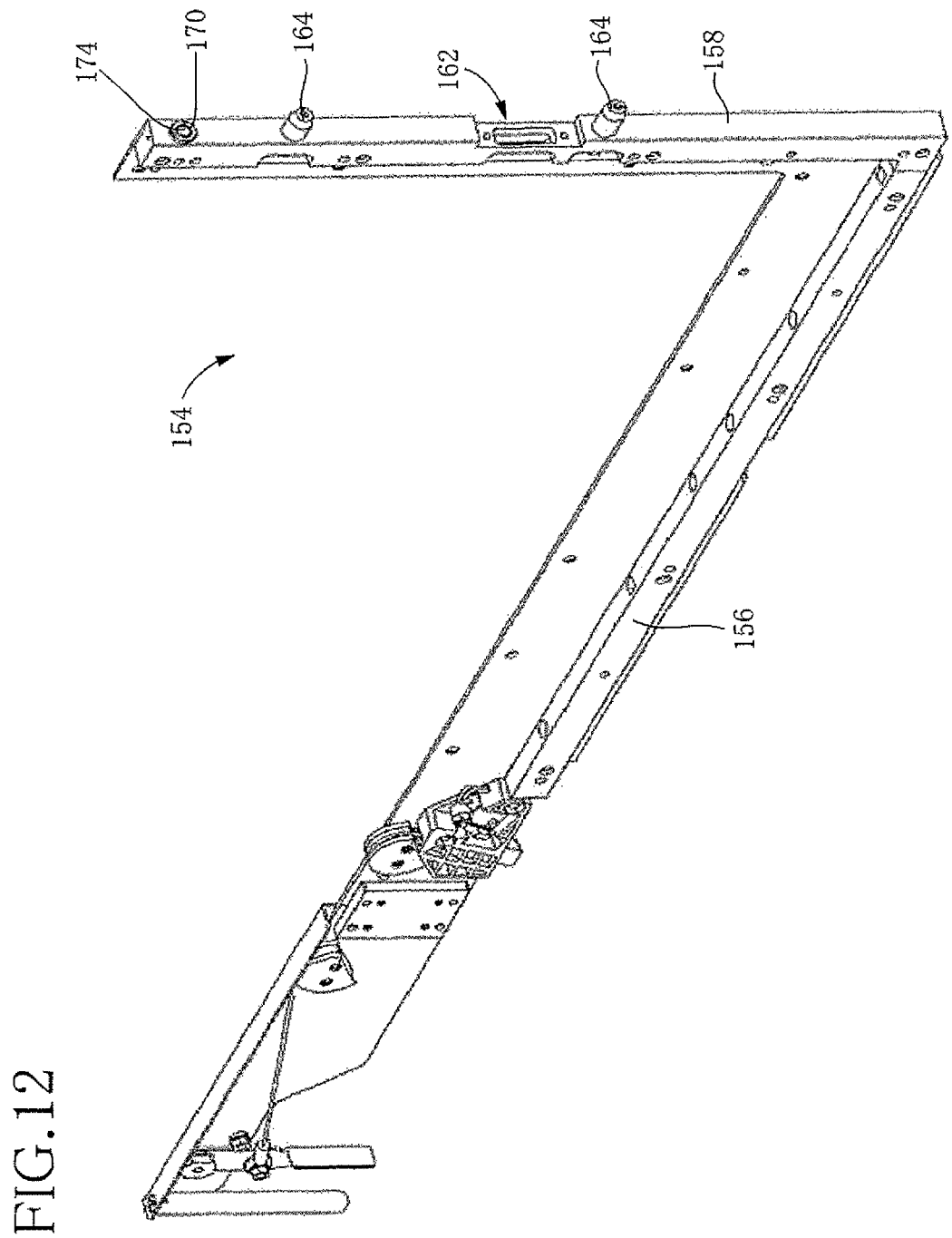
FIG. 12 is a perspective view of a device attachment member attached to a tape feeder of the component supplier shown in FIG. 8.

More specifically, as shown in FIG. 12, the feeder IF 154 is constituted by a T-groove guided portion 156 that extends in the front-rear direction and an upright portion 158 that extends in the vertical direction from one end of the T-groove guided portion 156. The T-groove guided portion 156 is fixed to a bottom of the tape feeder 110 having a generally rectangular shape as viewed from the lateral side thereof, and the upright portion 158 is fixed to one side of the tape feeder 110 in the front-rear direction, whereby the tape feeder 110 and the feeder IF 154 become integral with each other. A plurality of T-grooves 160 are formed in an upper surface of the support plate 114 of the feeder holding table 112 such that the T-grooves 160 extend in the front-rear direction so as to be parallel to one another. The T-groove guided portion 156 of the feeder IF 154 is configured to be fitted in the T-groove 160.

As shown in FIG. 12, a tape-feeder connector 162 as a device-side terminal is provided on one surface of the upright portion 158 of the feeder IF 154 that is opposite to another surface on which the tape feeder 110 is fixed. The tape-feeder connector 162 is electrically connected to the tape feeder 110. On the above-indicated one surface of the upright portion 158, a pair of engagement pins 164 are provided so as to extend in the front-rear direction. On the other hand, as shown in FIG. 9, on the upright wall 116 of the feeder holding table 112, a tape-feeder connector 166 to which the tape-feeder connector 162 is connectable and a pair of engagement holes 168 with which the pair of engagement pins 164 are engageable are provided so as to correspond to each of the plurality of T-grooves 160. In a state in which the feeder IF 154 attached to the tape feeder 110 is fitted in one T-groove 160, the feeder IF 154 is pushed toward the upright wall 116 of the feeder holding table 112, so that the tape-feeder connector 162 is connected to the tape-feeder connector 166 while the engagement pins 164 engage the engagement holes 168. As a result, the tape feeder 110 is electrically connected to the feeder holding table 112 and is installed on the feeder holding table 112 at a prescribed position of the feeder holding table 112. That is, the tape feeder 110 is electrically connected to the main central control device 70 (FIG. 15) via the feeder holding table 112 and is installed on the base 20 at a prescribed position of the base 20.

As in the holding-head IF 56, etc., a closed-end hole 170 is formed in the above-indicated one surface of the upright portion 158 of the feeder IF 154 on which the tape-feeder connector 162 and the engagement pins 164 are provided. An RF tag 172 (FIG. 15) having the same structure as the RF tag 74, etc., is disposed in the closed-end hole 170 so as to be sealed by resin 174. The RF tag 172 is also constituted by an IC chip 176 and an antenna 178 (FIG. 15). An antenna 180 (FIG. 15) capable of receiving the identification information transmitted from the RF tag 172 is disposed on the upright wall 116 of the feeder holding table 112 so as to be opposed to the opening of the closed-end hole 170 in a state in which the tape feeder 110 is installed on the feeder holding table 112. The antenna 180 is also connected to the main central control device 70 (FIG. 15), thereby permitting the tape feeder 110 to be identified by the control device. That is, the feeder IF 154 also functions as a transmitter-equipped member.

Figure 13:
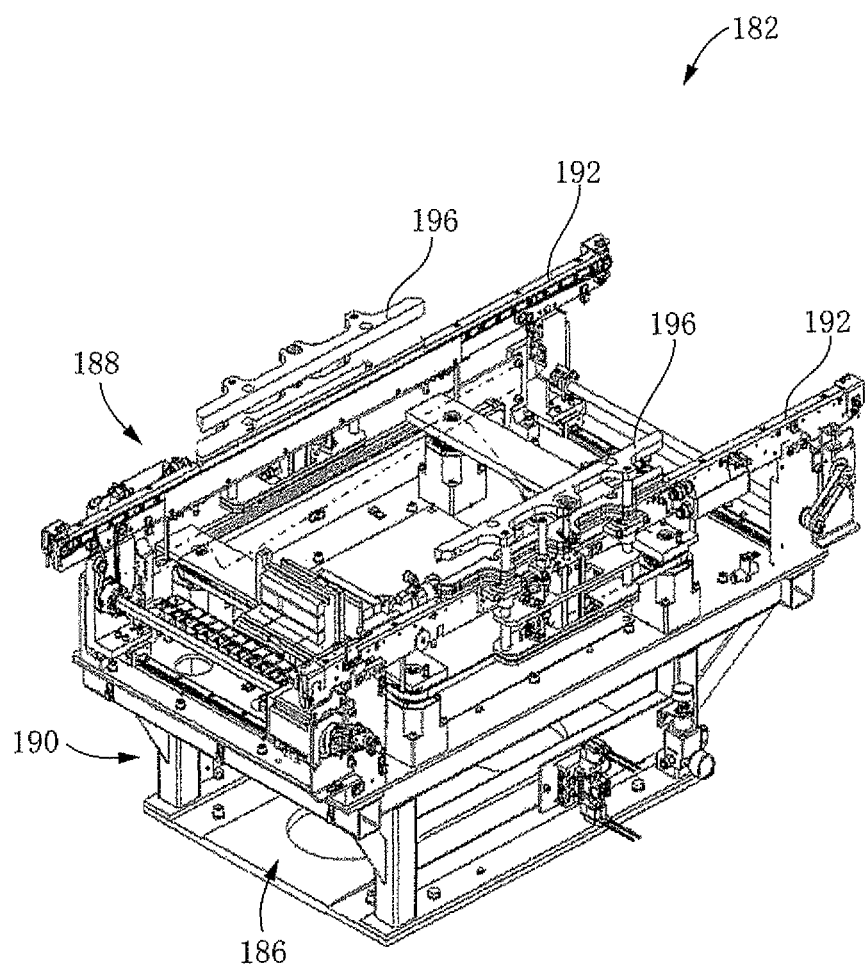
FIG. 13 is a perspective view showing a conveyor that can be installed on the manufacture work machine of FIG. 1.

Other than the component holding head 22, the dispenser head 24, and the component supplier 50, a conveyor 182 shown in FIG. 13 may be installed on the main frame 12. As shown in FIGS. 1 and 2, a conveyor installation portion 184 is formed at a substantially middle portion, in the front-rear direction, of the base 20 of the main frame 12, so as to extend in the left-right direction. The conveyor 182 is installed on the conveyor installation portion 184 via an interface 186 for the conveyor 186 (hereinafter abbreviated as "conveyor IF 186" where appropriate) as a device attachment member.

The conveyor 182 is constituted by a main body portion 188 and a leg portion 190 for supporting the main body portion 188. The main body portion 188 is constituted by: a pair of conveyor belts 192 configured to convey the substrate placed thereon in the left-right direction; a belt rotating device 194 (FIG. 15) configured to rotate the pair of conveyor belts 192; a pair of flange portions 196 provided above the pair of conveyor belts 192; and an elevating and lowering device 198 (FIG. 15) configured to fix the substrate by pushing the substrate onto the pair of flange portions 196. The thus structured conveyor 182 is capable of conveying the substrate to a prescribed position in the left-right direction and fixing the substrate at the prescribed position.

Figure 14:
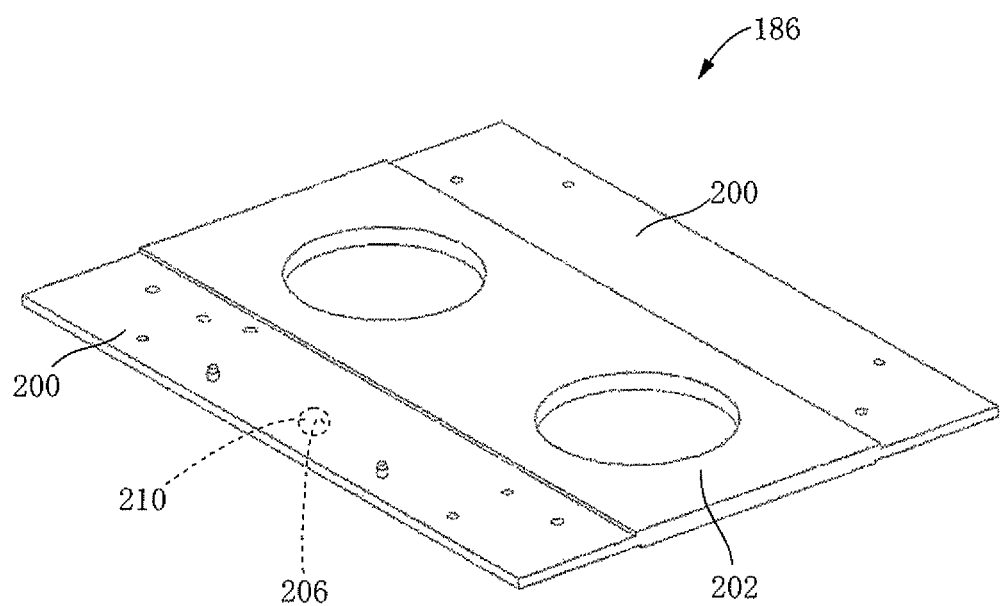
FIG. 14 is a perspective view of a device attachment member attached to the conveyor shown in Fig, 13.

As shown in FIG. 14, the conveyor IF 186 is a flat plate member having a generally rectangular shape and is constituted by a pair of leg support portions 200 located at opposite end portions in the width direction of the conveyor IF 186 and a central portion 202 located between the leg support portions 200. The leg portion 190 of the conveyor 182 is fixed on upper surfaces of the leg support portions 200, so that the conveyor IF 186 and the conveyor 182 become integral with each other. On a bottom surface of the conveyor installation portion 184 of the base 20, there are fixed a pair of placement plates 204 (one of which is shown in FIGS. 1 and 2) having substantially the same shape as the pair of leg support portions 200. In an upper surface of each of the placement plates 204, there is formed an engagement hole (not shown) that is to be engageable with an engagement pin (not shown) provided on a lower surface of each leg support portion 200 (opposite to an upper surface to which the conveyor 182 is fixed). According to the arrangement, the leg support portions 200 are substantially exactly fitted onto the placement plates 204, whereby the conveyor 182 is installed on the base 20 at a prescribed position of the base 20.

As in the holding-head IF 56, etc., a closed-end hole 206 is formed in the lower surface of one of the leg support portions 200, the lower surface being to come into close contact with the upper surface of the corresponding placement plate 204. An RF tag 208 (FIG. 15) having the same structure as the RF tag 74, etc., is disposed in the closed-end hole 206 so as to be sealed by resin 210. The RF tag 208 is constituted by an IC chip 212 and an antenna 214 (FIG. 15). An antenna 216 (FIG. 15) capable of receiving the identification information transmitted from the RF tag 208 is provided on one of the placement plates 204 so as to be opposed to the opening of the closed-end hole 206 in a state in which the conveyor 182 is installed on the conveyor installation portion 184. The antenna 216 is also connected to the main central control device 70 (FIG. 15), thereby permitting the conveyor 182 to be identified by the control device.

On the main frame 12, there is installed an image taking device 220 configured to take images of the substrate and the mount component. The image taking device 220 is constituted by: a base camera 222 (FIG. 1) for taking an image of the mount component held by the component holding head 22; and a head camera 224 (FIGS. 1, 3, and 7) for taking an image of the substrate, etc., on the conveyor 182. The base camera 222 is disposed on the base 20 between the conveyor 182 and the component supplier 50 and is capable of performing image taking upwardly thereof. The component holding head 22 that holds the mount component is moved to above the base camera 222, and the base camera 222 performs image taking. On the other hand, the head camera 224 is held by the slider 28 on which the component holding head 22 is installed and is capable of performing image taking downwardly thereof. The head camera 224 is moved by the head moving device 26 to above the conveyor 182 and the component supplier 50, whereby the head camera 224 can take images of the substrate and the mount component.

The present manufacture work machine 10 is constituted by the six devices, i.e., the component holding head 22, the dispenser head 24, the head moving device 26, the component supplier 50, the conveyor 182, and the image taking device 220. The six devices are respectively equipped with individual control devices. More specifically, as shown in FIG. 15, the head moving device 26 is equipped with a moving-device control device 230 for controlling operations of the X-direction moving device 34, the Y-direction moving device 36, and the two Z-direction moving devices 38, 40. Further, the head moving device 26 is equipped with four servo amps 232, 234, 236, 238 respectively corresponding to the four moving devices 34, 36, 38, 40. The moving-device control device 230 sends a control signal to each servo amp 232, 234, 236, 238, whereby the operation of each moving device 34, 36, 38, 40 is controlled.

The component holding head 22 is equipped with a component-holding-head control device 240 for controlling the operation of the positive/negative pressure supplier 54 and a drive circuit 242 for the positive/negative pressure supplier 54. The component-holding-head control device 240 sends a control signal to the drive circuit 242, whereby the operation of the positive/negative pressure supplier 54 is controlled. The dispenser head 24 is equipped with a dispenser-head control device 244 for controlling the operation of the ejection device 86 and a drive circuit 246 for the ejection device 86. The dispenser-head control device 244 sends a control signal to the drive circuit 246, whereby the operation of the ejection device 86 is controlled.

The feeder holding table 112 of the component supplier 50 is equipped with a supplier control device 248 for controlling the operation of the feeder drive device 152 of each tape feeder 110, and each tape feeder 110 is equipped with a drive circuit 250 for the feeder drive device 152. The supplier control device 248 and the drive circuit 250 are connected to each other via the tape-feeder connector 162 of the feeder IF 154. The supplier control device 248 sends a control signal to the drive circuit 250, whereby the operation of the feeder drive device 152 is controlled. The conveyor 182 is equipped with: a conveyor control device 252 for controlling the operations of the belt rotating device 194 and the elevating and lowering device 198; a drive circuit 254 for the belt rotating device 194; and a drive circuit 256 for the elevating and lowering device 198. The conveyor control device 252 sends a control signal to each of the drive circuits 254, 256, whereby the operations of the belt rotating device 194 and the elevating and lowering device 198 are controlled.

The image taking device 220 is equipped with an image-taking-device controller 258 for executing sending of control signals to perform image taking by the base camera 222 and the head camera 224 and for executing processing of image data obtained by the image taking. While the image-taking-device controller 258 is provided in a sub central control device 260 that will be explained, the image-taking-device controller 258 is independent in the sub central control device 260 and is connected to a capture board 264 of the image taking device 220 via a bus 262. Therefore, the image-taking-device controller 258 is not treated as a constituent element of the sub central control device 260, but is treated as a constituent element of the image taking device 220.

The manufacture work machine 10 is further equipped with a control device as a controller constituted by the main central control device 70 and the sub central control device 260 configured to control, in a centralized manner, the component holding head 22, the dispenser head 24, the head moving device 26, the component supplier 50, the conveyor 182, and the image taking device 220. The main central control device 70 is mainly for transmitting a motion command to each of the individual devices 230, 240, 244, 248, 252, 258 of the respective devices 22, 24, 26, 50, 182, 220. The main central control device 70 is connected, via a repeater hub 266, to the individual devices 230, 240, 244, 248, 252, 258 by respective serial communication cables 268 of the same kind for transmission of the motion commands.

The sub central control device 260 includes a sub central controller 270. In the sub central controller 270, there is stored a source program which is a basis of the motion commands to the individual control devices, namely, source data for performing a specific manufacture work. In the stored source data, the operation of each of the above-indicated six devices 22, 24, 26, 50, 182, 220 is encoded. The sub central controller 270 is configured to convert the source data into the motion commands in a specific programming language and to transmit the converted motion commands to the main central control device 70. The sub central controller 270 and the main central control device 70 are connected to each other by a LAN cable 274 via a hub 272, and the motion commands converted in the sub central controller 270 are transmitted to the main central control device 70 via the LAN cable 274. To the hub 272, one end of each of six LAN cables 274 which are identical to the LAN cable 274 in kind is connected, and another end of each of the six LAN cables 274 is connected to a corresponding one of the individual control devices of the respective six devices.

In the manufacture work machine 10, the identification information of each of the component holding head 22, the dispenser head 24, the component supplier 50, and the conveyor 182 is transmitted to the main central control device 70 via USB cables 276 of the same kind. More specifically, the antennas 82, 108 capable of respectively receiving the identification information of the component holding head 22 and the identification information of the dispenser head 24 are connected to the main central control device 70 by the USB cable 276 via a reader-writer 278 and a selector 280. The antennas 140, 216 capable of respectively receiving the identification information of the feeder holding table 112 of the component supplier 50 and the identification information of the conveyor 182 are connected to the main central control device 70 by the USB cable 276 via a reader-writer 282 and a selector 284. Further, the antennas 180 capable of receiving the identification information of the tape feeders 110 of the component supplier 50 is connected to the main central control device 70 by the USB cable 276 via a reader-writer 286 and a selector 288. Each of the selectors 280, 284, 288 connects a plurality of antennas and one reader-writer. Each of the reader-writers 278, 282, 286 decodes the identification information received by the antennas and transmits the decoded identification information to the main central control device 70. The identification information transmitted from the RF tags 74, 100, 132, 172, 208 and received by the antennas is encoded, and the encoded identification information is not recognized by the main central control device 70. Accordingly, the encoded identification information needs to be decoded by the reader-writers 278, 282, 286.

The present manufacture work machine 10 is provided with a display 290 of a touch-panel type through which information as to the operation of the manufacture work machine 10 is inputted and outputted. The display 290 is connected to the main central control device 70 and the sub central controller 270. More specifically, the display 290 is connected to the main central control device 70 by a LAN cable 274 which is identical to the above-indicated LAN cable 274 in kind via the hub 272 and is connected to the sub central controller 270 by a serial communication cable 292 and an RGB analog cable 294. The manufacture work machine 10 is further provided with an emergency stop switch 296 that is connected to the main central control device 70 and the individual control devices of the respective devices 22, 24, 26, 50, 182, 220 by I/O cables 300 via a terminal relay 298. To the main central control device 70, there are connected: a plurality of switches 302 such as a power source switch and a start-up switch of the manufacture work machine 10; and a plurality of indicator lamps 304 such as an indicator lamp indicating that the manufacture work machine 10 is in startup and an indicator lamp indicating that the manufacture work machine 10 is in an operable state. The serial communication cable 268, the LAN cable 274, the I/O cable 300 are connected to the individual control devices 240, 244, 248 of the component holding head 22, the dispenser head 24, and the component supplier 50 via the connectors 62, 94, 126 provided in the interfaces 56, 88, 122 corresponding to the respective devices 22, 24, 50.

<Operation of Manufacture Work Machine>

In the present manufacture work machine 10, the six devices, i.e., the component holding head 22, the dispenser head 24, the head moving device 26, the component supplier 50, the conveyor 182, and the image taking device 220, perform respective works according to the source data stored in the sub central controller 270, whereby a mounting work of mounting the component onto the substrate is performed. It is noted, however, that the component holding head 22, the dispenser head 24, the component supplier 50, and the conveyor 182 among the above-indicted six devices 22, 24, 26, 50, 182, 220 is configured to be able to perform respective works only when the identification information of the respective four devices 22, 24, 50, 182 is confirmed by the main central control device 70.

More specifically, in an instance where the four devices 22, 24, 50, 182 are installed on the main frame 12 via the corresponding interfaces 56, 88, 122, 154, 186, the identification information of the respective devices 22, 24, 50, 182 is transmitted from the corresponding RF tags 74, 100, 132, 172, 208 incorporated in the respective interfaces 56, 88, 122, 154, 186 upon startup of the manufacture work machine 10. The transmitted identification information is received by the corresponding antennas 82, 108, 140, 180, 216 provided so as to correspond to the respective devices, and the received identification information is transmitted to the corresponding reader-writers 278, 282, 286 via the corresponding selectors 280, 284, 288. The reader-writers 278, 282, 286 decode the identification information transmitted thereto and transmit the decoded identification information to the main central control device 70 via the corresponding USB cables 276. In this way, the identification information of the respective devices 22, 24, 50, 182 is confirmed by the main central control device 70, so that the devices 22, 24, 50, 182 are identified by the main central control device 70. When the devices 22, 24, 50, 182 are identified, the above-indicated six devices 22, 24, 26, 50, 182, 220 perform the respective works according to the source data.

To be more specific, the source data relating to the assembling work is initially converted in the sub central controller 270 into a plurality of motion commands for the respective devices. The plurality of motion commands are transmitted from the sub central controller 270 to the main central control device 70 via the LAN cable 274 and are sequentially transmitted by the main central control device 70 to the individual control devices of the respective six devices 22, 24, 26, 50, 182, 220 via the respective serial communication cables 268. The motion commands transmitted from the main central control device 70 are transmitted to all of the individual control devices without particularly specifying destination devices. However, each motion command designates the device to be operated by the motion command. Therefore, the individual control device of the device to be operated receives the motion command corresponding thereto, and the device in question operates in accordance with the motion command. That is, the main central control device 70 is configured to transmit the motion command to each of the six devices 22, 24, 26, 50, 182, 220 according to a certain specific protocol. On the other hand, the identification information of each of the above-indicated four devices 22, 24, 50, 182 is configured to be transmitted to the main central control device 70 according to a protocol different from the certain specific protocol indicated above.

The motion commands corresponding to the six devices 22, etc., will be briefly explained. The motion commands corresponding to the conveyor 182 include a motion command for conveying the substrate to a specific position and a motion command for conveying the substrate from the specific position. The motion command corresponding to the component supplier 50 includes a motion command for supplying the mount component to a specific position. The motion command corresponding to the dispenser head 24 includes a motion command for ejecting an adhesive onto the substrate. The motion commands corresponding to the component holding head 22 include a motion command for holding the mount component supplied by the component supplier 50 and a motion command for releasing the mount component held by the component holding head 22 onto the substrate on which the adhesive has been ejected. The motion commands corresponding to the head moving device 26 include a motion command for moving the component holding head 22 and the dispenser head 24 to a specific position above the substrate and a motion command for moving the mount component supplied by the component supplier 50 to a position at which the mount component can be held by the component holding head 22. The motion commands corresponding to the image taking device 220 include: a motion command for permitting the base camera 222 to take an image of the mount component held by the component holding head 22 and for obtaining information as to the holding state on the basis of data of the taken image and a motion command for permitting the head camera 224 to take an image of the substrate and for obtaining positional information of the substrate on the basis of data of the taken image. On the basis of the motion commands, the above-indicated six devices perform the respective works, thereby producing an article in which the mount component is fixed onto the substrate by the adhesive.

When the identification information of the respective devices 22, 24, 50, 182 is confirmed by the main central control device 70, the motion commands are transmitted, so that each device performs the work. In some cases, the work is not performed by each device even where the identification information is confirmed by the main central control device 70. More specifically, in the manufacture work machine 10 constructed as described above, one antenna can receive the identification information of one device. However, the present manufacture work machine 10 employs the antennas with the so-called anti-collision function. Accordingly, each antenna is capable of receiving and confirming a plurality of pieces of identification information, and one antenna may sometimes receive a plurality of pieces of identification information due to some reasons. This hardly happens in a normal use of the manufacture work machine, and it is accordingly considered that some abnormalities are occurring. Therefore, where a plurality of pieces of identification information is confirmed from one antenna, the motion commands are stopped to be transmitted.

When the source data is converted in the sub central controller 270 into a plurality of motion commands, performable-motion information is referred to. The performable-motion information is information as to the motion that can be performed by each device. The performable-motion information may be stored in advance in the sub central controller 270 or the like, and the performable-motion information of each device may be referred to by utilizing the identification information transmitted from each device. To be more specific, the identification information of the device that is transmitted therefrom upon its startup may contain a distinction ID of the device, and there may be stored, in the sub central controller 270 or the like, a correspondence table indicating a correspondence between the distinction ID and the performable-motion information of the device. Then the performable-motion information may be arranged to be referred to on the basis of the distinction ID. In this arrangement, the performable-motion information can be referred to by utilizing the identification information of each device when the motion command is generated. Further, the identification information may directly contain the performable-motion information. Moreover, the identification information may contain not only the distinction ID and the performable-motion information, but also various sorts of information. For instance, the identification information may contain manufacture identification information based on which a manufacture of the device can be identified (e.g., "01" where the device is manufactured by a company A), device-type identification information based on which the work that can be performed by the device can be identified (e.g., "CH" where the device is a device for holding and releasing a component, i.e., the so-called carry head device), or device identification information based on which the device per se can be identified (e.g., a manufacturing lot number of the device or a type number of the device).

The performable-motion information includes a motion that can be performed by each device, an operating range, dimensions, capabilities (performance), control gains, etc., of each device. The motion that can be performed by each device includes a motion that can be performed by each device when the device performs the work. More specifically, the performable-motion information includes supply of the components where the device is the component supplier 50. The performable-motion information includes holding or releasing of the component where the device is the component holding head 22. The capabilities (performance) of the device includes output capabilities of an electromagnetic motor where the device is equipped with the electromagnetic motor, concretely, a feeding pitch of the taping by the electromagnetic motor where the device is the tape feeder 110 of the component supplier 50.

<Replacement of Device Installed on Main Frame>

As shown in FIG. 2 indicating a state in which the component holding head 22, the dispenser head 24, the component supplier 50, and the conveyor 182 are removed from the main frame 12, the component holding head 22, the dispenser head 24, the component supplier 50, and the conveyor 182 are easily installable on and removable from the main frame 12. To be more specific, the component holding head 22 as the work head device 22 and the dispenser head 24 as the work head device 24 are easily installable on and removable from the respective sliders 28, 30 via the holding-head IF 56 and the dispenser-head IF 88, respectively, as interfaces 56, 58 for the work head devices 22, 24 (hereinafter referred to as "head-device IFs 56, 58" where appropriate). The tape feeder 110 of the component supplier 50 is installable on and removable from the feeder holding table 112 via the feeder IF 154, and the feeder holding table 112 is easily installable on and removable from the base 20 by utilizing the slide mechanism 120, via the holding-table IF 122 and the pair of guide rails 118. The conveyor 182 is easily installable on and removable from the conveyor installation portion 184 of the base 20 via the conveyor IF 186. Thus, the above-indicated devices 22, etc., are configured to be easily installable and removable by being installed on the main frame 12 via the corresponding interfaces 56, etc.

Figure 16:
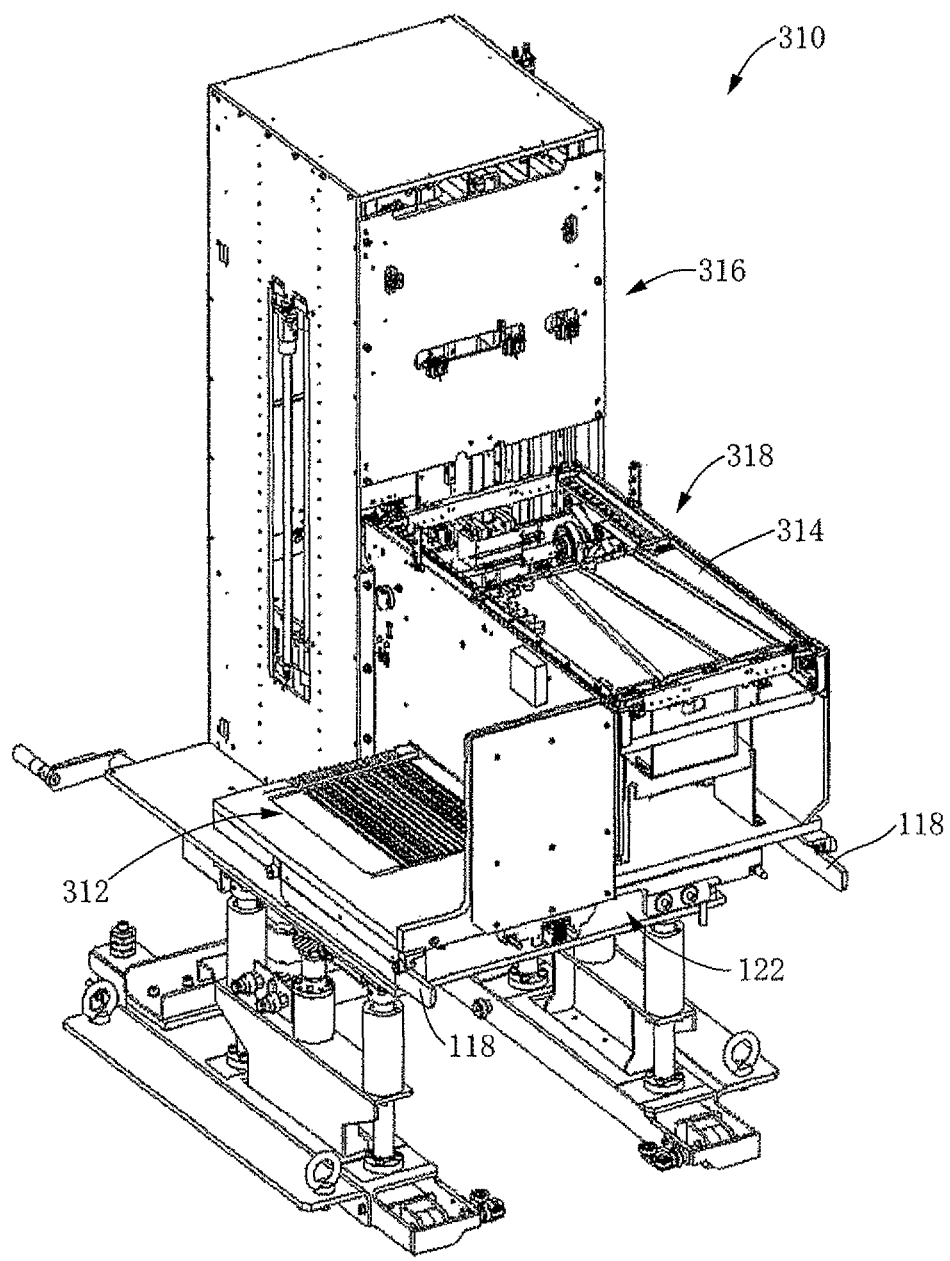
FIG. 16 is a perspective view showing a component supplier different from the component supplier of FIG. 8.
Figure 17:
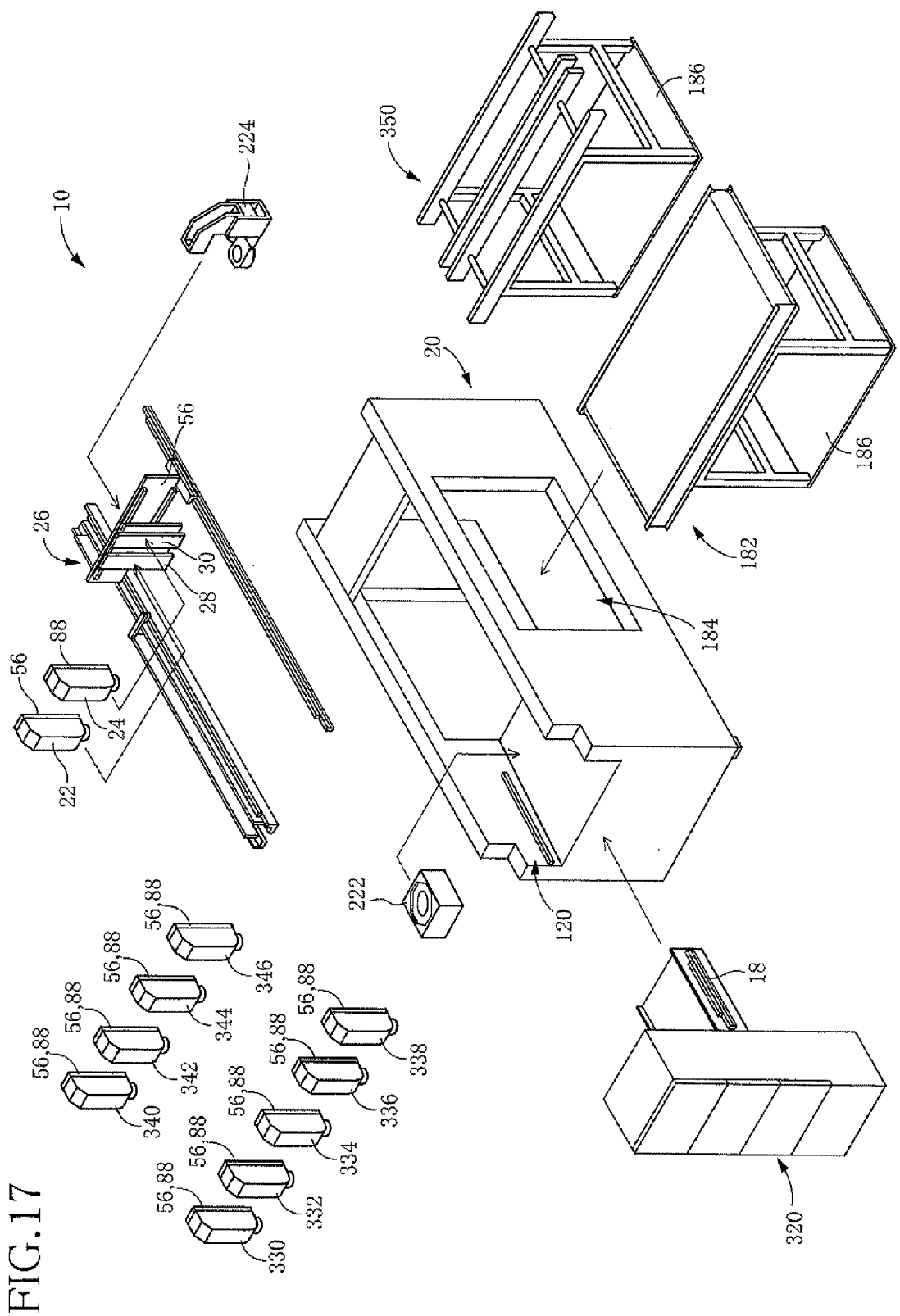
FIG. 17 is a perspective view showing a base of the manufacture work machine of FIG. 1 and a plurality of devices detached from the base.

To the respective positions at which the work head devices 22, 24, the component supplier 50, and the conveyor 182 have been installed, other work head devices, other component suppliers, and other conveyors can be installed in place of the work head devices 22, 24, the component supplier 50, and the conveyor 182. To be more specific, in place of the component supplier 50, a component supplier 310 shown in FIG. 16 can be installed. The component supplier 310 includes: a feeder holding portion 312 to which tape feeders each having a structure similar to that of the tape feeders 110 are installed; an accommodating portion 316 in which are accommodated a plurality of component trays 314 on each of which the mount components are placed: and a tray moving device 318 configured to move one of the component trays 314 from the accommodating portion 316 to a position at which the component can be supplied to the component holding head 22. That is, the component supplier 310 is formed such that a tape-feeder-type supplier and a tray-unit-type supplier become integral to each other. To the component supplier 310, there are attached a holding-table IF and a pair of guide rails that are the same as the holding-table IF 122 and the pair of guide rails 118 attached to the feeder holding table 112 of the component supplier 50 are attached. According to the arrangement, the component supplier 310 can be easily installed on the base 20, in place of the component supplier 50. Further, a supplier 320 of a tray unit type (FIG. 17) can be installed, in place of the component supplier 50. To the supplier 320, the above-indicated holding-table IF and the pair of guide rails 118 are attached. According to the arrangement, the supplier 320 can be also installed easily on the base 20, in place of the component supplier 50. Where the component supplier is the tray-unit-type supplier, it is possible to supply components with a larger size, as compared with the tape-feeder type supplier. That is, in the present manufacture work machine 10, the component supplier can be replaced with another one depending upon the component to be supplied, enabling various products to be manufactured.

To the respective positions at which the work head devices 22, 24 are installed, namely, to the sliders 28, 30, other work head devices can be installed, in place of the work head devices 22, 24. To be more specific, there may be installed: a high-frequency welder 330 for performing a heat treatment by a high-frequency wave: a laser generator 332 for performing laser processing; a UV irradiator 334 for performing processing by UV irradiation; a hot-air blower 336 for performing a heat treatment by applying hot air; a screw fastener 338 for performing screw fastening processing; a screw attaching/fastening device 340 for performing screw holding/releasing and screw fastening processing in a state in which a screw is held; a double dispenser 342 having two dispenser nozzles and configured to perform ejection of two kinds of auxiliary agents; a mounter 344 for performing holding and releasing another component and for performing adjustment of a component hold position; and a solder cream printer 346. The head-device IFs 56, 88 are attached to the high-frequency welder 330, the laser generator 332, etc., that can be installed in place of the work head devices 22, 24. The high-frequency welder 330, the laser generator 332, etc., are installed on the sliders 28, 30 via the head-device IFs 56, 88. Accordingly, the high-frequency welder 330, the laser generator 332, etc., can be easily installed on and removed from the sliders 28, 30.

As explained above, in the present manufacture work machine 10, there can be employed, as the work head device, the devices having various functions. Accordingly, where there arises a need of performing a work of fixing a component to a substrate due to design changes or the like, in place of the work of fixing the component to the substrate by the adhesive, for instance, it is possible to deal with the need not by changing the manufacture work machine per se, but by replacing the dispenser head 24 with the screw attaching/fastening device 340. Moreover, while the manufacture work in the manufacture work machine 10 is the assembling work, the work head device may be changed so as to perform, as the manufacture work, a work in which certain processing, treatment or the like is performed on the work object. More specifically, the work head device may be changed so as to perform various sorts of works such as a work (e.g., a press work) in which the work object is deformed, a work (e.g., a cut-off work) in which a part of the work object is cut off, a work (e.g., a cutting work) in which the work object is shaped, a work (e.g., a surface modification work) in which a surface of the work object is modified by laser, plasma or the like, a work (e.g., a surface finishing work) such as grinding, a work of irradiating the work object with a light, ultraviolet rays, an electromagnetic wave, etc., for the purpose of fixation, curing, etc. In other words, according to the present manufacture work machine, various manufacture works can be performed by changing the work head devices.

In place of the conveyor 182, other kinds of conveyors may be installed such as a double conveyor 350 of a module type (FIG. 17), a single conveyor, a conveyor of a lift and carry type, or a conveyor of a pick and place type (illustration of which is omitted). The conveyor IF 186 is attached to the double conveyor 350, the single conveyor, etc., that can be installed in place of the conveyor 182. The double conveyor 350, the single conveyor, etc., are installed on the conveyor installation portion 184 of the base 20 via the conveyor IF 186. Accordingly, the double conveyor 350, the single conveyor, etc., are also easily installable on and removable form the base 20. The conveyor of the lift and carry type is configured to lift, by an elevating and lowering mechanism, a holding table on which the substrate or the like is placed and to carry the thus lifted holding table in the conveyance direction by a carrying mechanism. Accordingly, the conveyor of the lift and carry type is capable of properly conveying the work object even where the work object is relatively heavy. The conveyor of the pick and place type is configured to lift the work object such as the substrate by suction and to move the sucked work object in the conveyance direction.

Accordingly, the conveyor of the pick and place type is capable of properly conveying the work object even where the work object has a relatively fragile structure. Thus, in the present manufacture work machine 10, it is possible to change the conveyors depending upon the work object such as the substrate, enabling various products to be manufactured.

The head moving device 26, the base camera 222, and the head camera 224 are also removable from the base 20 and are replaceable with other head moving devices and cameras. However, in the present manufacture work machine 10, the head moving device 26, the base camera 222, and the head camera 224 are not equipped with interfaces corresponding thereto, and the devices 26, etc., are not configured to be easily installed on and removed from the base 20. It is noted, however, that the devices 26, etc., may be equipped with interfaces corresponding thereto and the devices 26, etc., may be installed on the base 20 via the interfaces, thereby realizing easy installation on and removal from the base.

<Construction of Manufacture Work Machine>

As explained above, the present manufacture work machine is constituted by the main frame 12 and the plurality of devices installed on the main frame 12. The plurality of devices installed on the main frame 12 are selectable from among various devices. Accordingly, in order to construct the manufacture work machine in accordance with a user's demand, the user needs to determine the devices to be installed on the main frame 12 in accordance with the manufacture work to be performed and to prepare the determined plurality of devices.

As a method of preparing the plurality of devices, the user may purchase the main frame 12 from a certain maker. The user may further purchase the plurality of devices to be installed on the main frame 12 from the certain maker. That is, in this instance, the user purchases the manufacture work machine from the certain maker. As an alternative, the user may purchase the main frame 12 from a certain maker and may purchase at least one of the plurality of devices to be installed on the main frame 12 from another maker different from the certain maker. (Hereinafter, the above-indicated another maker may be referred to as "third vender" where appropriate for distinction from the certain maker.) In this instance, it is possible to use the device produced by the third vendor with high technological skills. Moreover, at least one of the plurality of devices may be produced by a user himself. In this instance, the user is free from a risk that information about the product is known to others, and therefore, confidentiality of the information about the product is ensured.

As explained above, however, in order to install the devices on the main frame 12, the interfaces corresponding to the respective devices are required. To be more specific, the work head devices require the head-device IFs 56, 88. The component supplier requires the holding-table IF 122. The tape feeder requires the feeder IF 154. The conveyor requires the conveyor IF 186. Further, for permitting the devices to be identified by the control device when the control by the control device is executed, there are required the RF tags capable of transmitting the identification information of the respective devices. Accordingly, the interfaces corresponding to the respective devices are required. Hence, where a party, such as the third vendor, other than the certain maker produces the device to be installed on the main frame, the party in question needs to purchase the interface corresponding to the device from the certain maker and to produce the device by attaching the interface thereto. In this respect, for the component supplier, not only the holding-table IF 122, but also the pair of guide rails 118 need to be purchased from the certain maker in view of ease of installation on the base 20, and the guide rails 118 need to be mounted on the component supplier.

As described above, where the party other than the certain maker purchases the interfaces corresponding to the respective devices and produce the devices by attaching the purchased interfaces to the devices, it is possible to produce the devices that are physically and electrically installable on and removable from the main frame 12 without any design changes for adapting the devices to the main frame 12. Moreover, for the maker that produces and sells the main frame 12 and the manufacture work machine, it is possible to grasp the party that produces the devices to be installed on the main frame, so that the reliability of the devices can be ensured and the reliability of the manufacture work machine per se can be ensured.

However, there may be a party among the third vendors and so on that is reluctant to purchase the interfaces from the certain maker and that tries to produce the interfaces by itself. Existence of such a party cannot ensure the reliability of the devices to be installed on the main frame, and may pose a threat to the reliability of the manufacture work machine per se. In view of this, in each of the interfaces employed in the present manufacture work machine, the RF tag capable of transmitting the identification information of the corresponding device is disposed in the hole so as to be sealed by the resin. According to the arrangement, the RF tag is difficult to be taken out of the interface. Therefore, where a malicious third vendor or the like tries to forcibly take the RF tag out of the interface, for instance, the RF tag will be easily broken. Since the RF tag is disposed in the hole without clearance, it is very difficult to take the RF tag out of the interface without breaking the RF tag. The third vendor or the like cannot produce the interface without the RF tag. Accordingly, it is essential for a party who wishes to produce the device to be installed on the main frame to purchase the interface from the certain maker indicated above.

If a malicious third vendor or the like should take the RF tag out of the interface and attach the RF tag to a vicinity of an antenna capable of receiving the identification information, the device might operate in the manufacture work machine even where the authorized interface is not attached to the device. However, where the device to which the authorized interface is attached is installed at a position at which the RF tag is attached to the vicinity of the antenna, the antenna will receive two sorts of identification information because the antenna employed in the present manufacture work machine has the anti-collision function. In this case, the control device judges that some abnormalities are occurring, and the motion commands are stopped to be transmitted, as described above. Thus, even if the RF tag should be taken out of the interface, it is possible to prevent the RF tag to be abused.

DESCRIPTION OF REFERENCE SIGNS

10: manufacture work machine 12: main frame 22: component holding head (device) 24: dispenser head (device) 26: head moving device (device-holder moving device) 28: slider (device holder) 30: slider (device holder) 50: component supplier (device) 56: holding-head interface (device attachment member) (transmitter-equipped member) 58: rear plate portion (main body) 62: leg portion (device-side engagement portion) 64: engagement block (device-side engagement portion) 66: support portion (frame-side engagement portion) 68: block fitting portion (frame-side engagement portion) 69: holding-head connector (device-side terminal) 70: main central control device (controller) 72: closed-end hole (hole) 74: RF tag (transmitter) 76: resin (thermoplastic resin) 78: IC chip (identification-information recording medium) 82: antenna 88: dispenser-head interface (device attachment member) (transmitter-equipped member) 90: leg portion (device-side engagement portion) 92: engagement block (device-side engagement portion) 94: dispenser-head connector (device-side terminal) 96: IC chip (identification-information recording medium) 100: RF tag (transmitter) 102: resin (thermoplastic resin) 104: closed-end hole (hole) 106: support portion (frame-side engagement portion) 107: block fitting portion (frame-side engagement portion) 108: antenna 110: tape feeder (device) 112: feeder holding table (device) 122: holding-table interface (device attachment member) (transmitter-equipped member) 124: connection surface (frame contact surface) 126: holding-table connector (device-side terminal) 128: engagement pin (device-side engagement portion) 130: closed-end hole (hole) 132: RF tag (transmitter) 134: resin (thermoplastic resin) 136: IC chip (identification-information recording medium) 140: antenna 154: feeder interface (device attachment member) (transmitter-equipped member) 156: T-groove guided portion (device-side engagement portion) 160: T-groove (frame-side engagement portion) 162: tape-feeder connector (device-side terminal) 164: engagement pin (device-side engagement portion) 166: tape-feeder connector (frame-side terminal) 168: engagement hole (frame-side engagement portion) 170: closed-end hole (hole) 172: RF tag (transmitter) 174: resin (thermoplastic resin) 176: IC chip (identification-information recording medium) 180: antenna 182: conveyor (device) 186: conveyor interface (device attachment member) (transmitter-equipped member) 206: closed-end hole (hole) 208: RF tag (transmitter) 210: resin (thermoplastic resin) 212: IC chip (identification-information recording medium) 216: antenna 310: component supplier (device) 320: supplier (device) 330: high-frequency welder (device) 332: laser generator (device) 334: IN irradiator (device) 336: hot-air blower (device) 338: screw fastener (device) 340: screw attaching/fastening device (device) 342: double dispenser (device) 344: mounter (device) 346: solder cream printer (device) 350: double conveyer (device)

The invention claimed is:

1. A device attachment member used for a manufacture work machine, the manufacture work machine being equipped with a device necessary for performing a manufacture work, a main frame on which the device is to be installed, and a controller configured to control the device, the device attachment member comprising:
   a main body configured to be attached to the device;
   an identification-information recording medium in which is recorded identification information, the device being identified by the controller based on the identification information upon transmission of the identification information to the controller via first transmission path, the identification-information recording medium being incorporated in the main body; and
   a communication cable provided on the main body and through which the controller transmits a command for controlling the device via a second transmission path which is different from the first transmission path.

2. The device attachment member according to claim 1, further comprising
   a transmitter which is capable of transmitting the identification information recorded in the identification-information recording medium and which incorporates the identification-information recording medium.

3. The device attachment member according to claim 2, wherein
   the main body has a hole that is open to a surface, and
   the transmitter is disposed in the hole so as to be sealed by resin.

4. The device attachment member according to claim 3, wherein
   the transmitter is an RF tag.

5. The device attachment member according to claim 2, wherein
   the transmitter is configured to transmit the identification information recorded in the identification-information recording medium according to a protocol different from a protocol according to which the controller is configured to transmit the command for controlling the device.

6. The device attachment member according to claim 1, further comprising
   a device-side terminal fixed to the main body and configured to be connected to a frame-side terminal provided in the main frame, for electrically connecting the device and the controller to each other via the communication cable when the device is controlled by the controller, the controller being configured to transmit the command for controlling the device via the device-side terminal.

7. The device attachment member according to claim 1, further comprising
a device-side engagement portion provided in the main body for positioning the device at a prescribed position and configured to engage a frame-side engagement portion provided in the main frame.

8. The device attachment member according to claim 1, wherein
the main body includes a device attachment surface to be attached to the device and a frame contact surface to be held in close contact with a part of the main frame when the device to which the main body is attached is installed on the mainframe, and the main body is configured such that the device is installed on the main frame via the main body.

* * * * *